(12) United States Patent
Foote et al.

(10) Patent No.: US 8,298,901 B1
(45) Date of Patent: Oct. 30, 2012

(54) METHOD FOR MANUFACTURING BIPOLAR TRANSISTORS

(75) Inventors: Richard W. Foote, Kennedale, TX (US);
Edward F. Pressley, Arlington, TX (US); Joseph A. DeSantis, San Jose, CA (US); Alexei Sadovnikov, Sunnyvale, CA (US); Christoher J. Knorr, Los Gatos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1463 days.

(21) Appl. No.: 11/441,808

(22) Filed: May 26, 2006

(51) Int. Cl.
*H01L 21/331* (2006.01)
*H01L 21/8222* (2006.01)

(52) U.S. Cl. .................. 438/309; 257/E21.371
(58) Field of Classification Search .......... 438/309; 257/E21.371
See application file for complete search history.

(56) References Cited

U.S. PATENT DOCUMENTS

| | | | | |
|---|---|---|---|---|
| 4,392,149 A * | 7/1983 | Horng et al. | ............ | 257/518 |
| 4,412,378 A * | 11/1983 | Shinada | ................ | 438/370 |
| 5,077,227 A * | 12/1991 | Kameyama et al. | ...... | 438/365 |
| 5,338,696 A * | 8/1994 | Ilderem et al. | ............ | 438/202 |
| 6,180,478 B1 * | 1/2001 | Lee et al. | ............ | 438/309 |
| 6,465,317 B2 * | 10/2002 | Marty | ............ | 438/321 |
| 6,593,640 B1 * | 7/2003 | Kalnitsky et al. | ....... | 257/565 |
| 6,767,798 B2 * | 7/2004 | Kalnitsky et al. | ....... | 438/341 |
| 6,846,710 B2 * | 1/2005 | Yi et al. | ............ | 438/202 |
| 6,858,485 B2 * | 2/2005 | Freeman et al. | ....... | 438/202 |
| 2003/0183903 A1 * | 10/2003 | Ikeda | ............ | 257/566 |
| 2005/0051797 A1 * | 3/2005 | Fan et al. | ............ | 257/197 |
| 2006/0148188 A1 * | 7/2006 | Liu et al. | ............ | 438/329 |

OTHER PUBLICATIONS

Improving The Inverse Beta of NPN Transistors. Mar. 1979. IBM Technical Disclosure Bulletin, Mar. 1979, US, vol. No. 21, Issue No. 10, p. No. 4034-4035.*

* cited by examiner

*Primary Examiner* — Zandra Smith
*Assistant Examiner* — Igwe U Anya
(74) *Attorney, Agent, or Firm* — Wade J. Brady, III; Frederick J. Telecky, Jr.

(57) ABSTRACT

An improved method for manufacturing bipolar transistors is disclosed. The method for forming a PNP transistor comprises the steps of forming a P type collector on a substrate, forming a PNP epitaxial base on the P type collector, forming a PNP extrinsic base in the PNP epitaxial base, and forming a PNP emitter in contact with the PNP extrinsic base. The method for forming an NPN transistor comprises the steps of forming an N type collector on a substrate, forming a NPN epitaxial base on the N type collector, forming an NPN extrinsic base in the NPN epitaxial base, and forming an NPN emitter in contact with the NPN extrinsic base. The PNP and NPN transistors may be manufactured in the same control flow process.

23 Claims, 28 Drawing Sheets

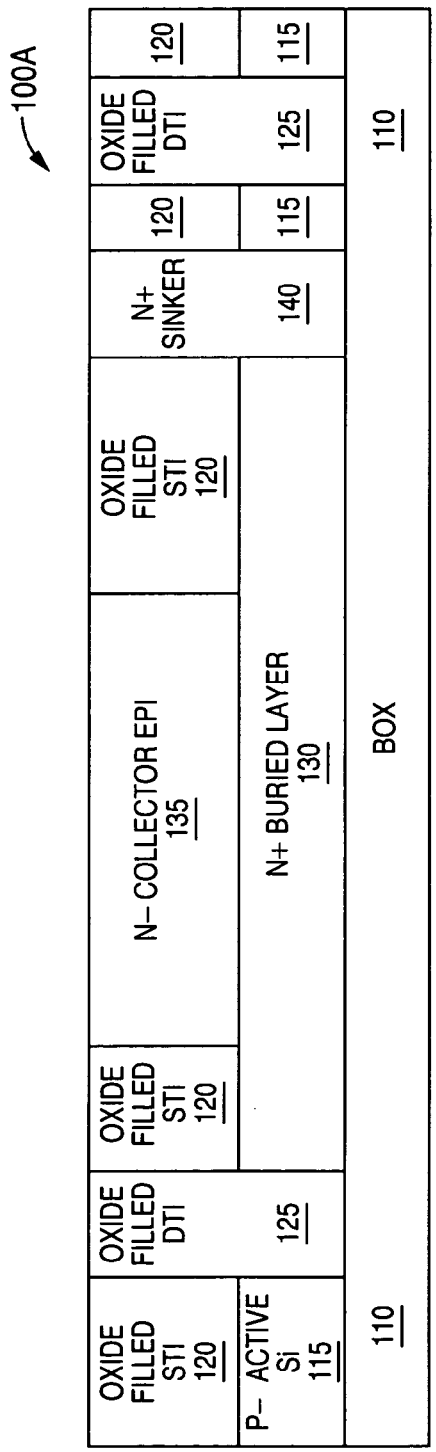
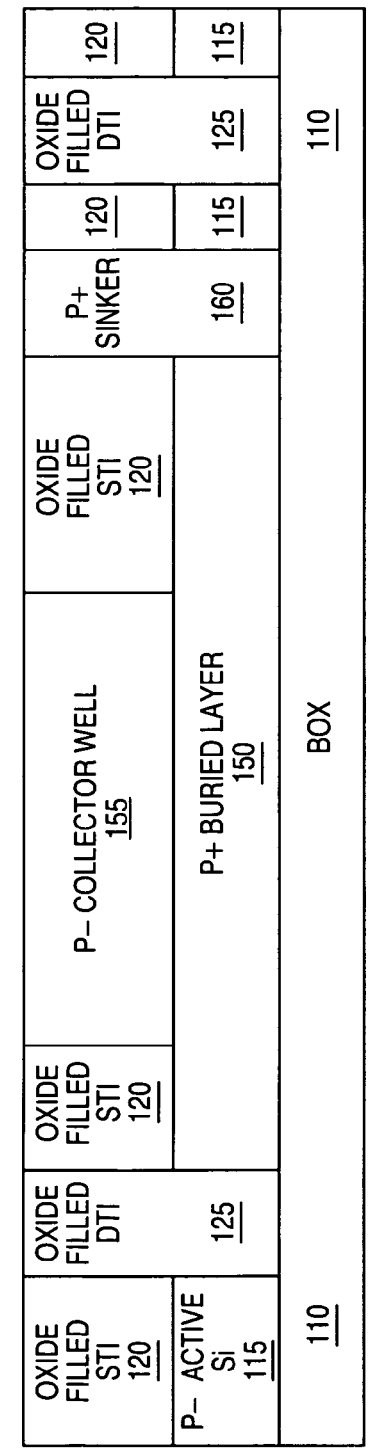
FIG. 1A
FIG. 1B

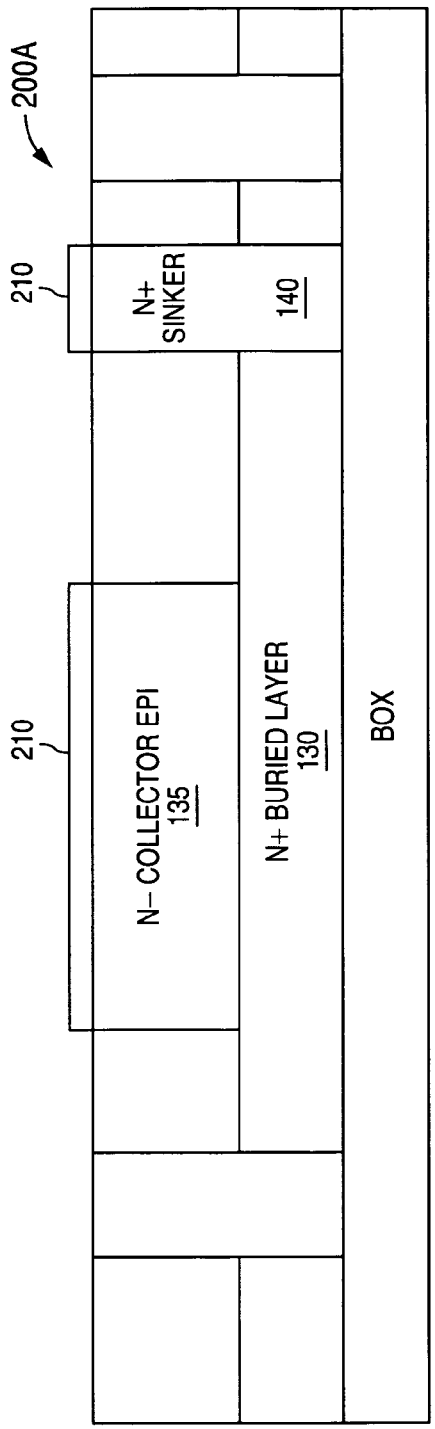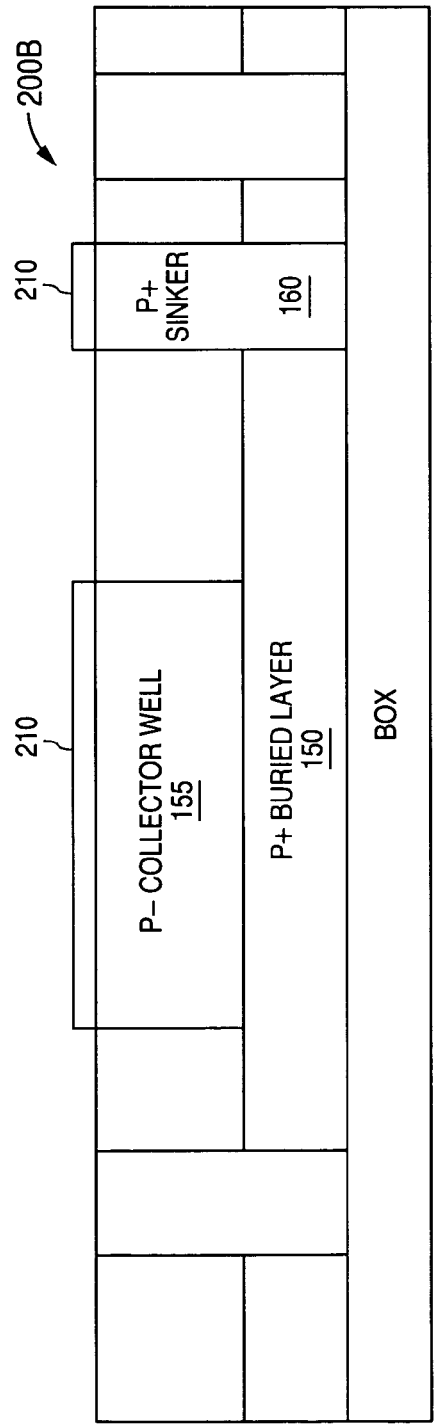
FIG. 2A
FIG. 2B

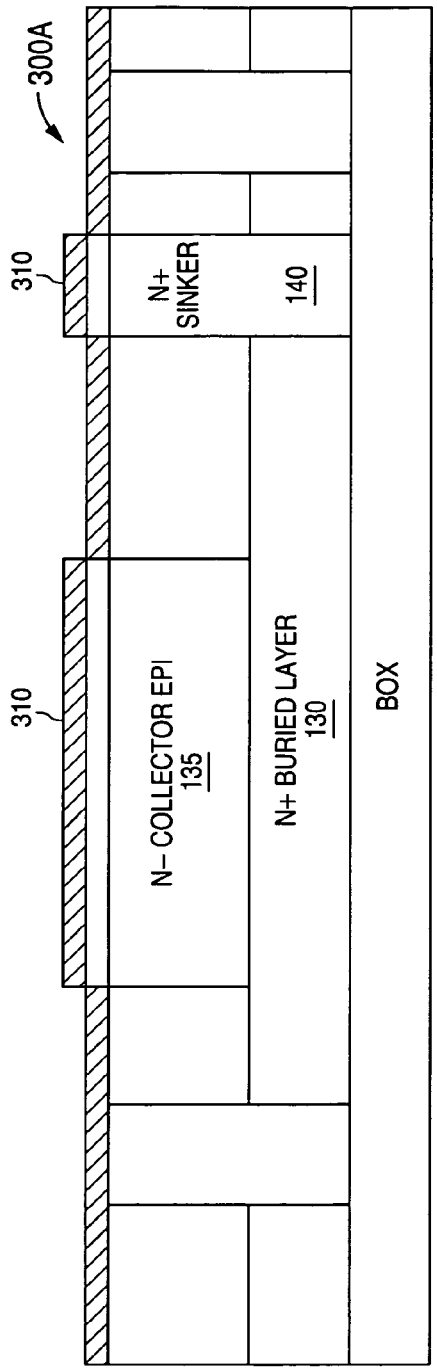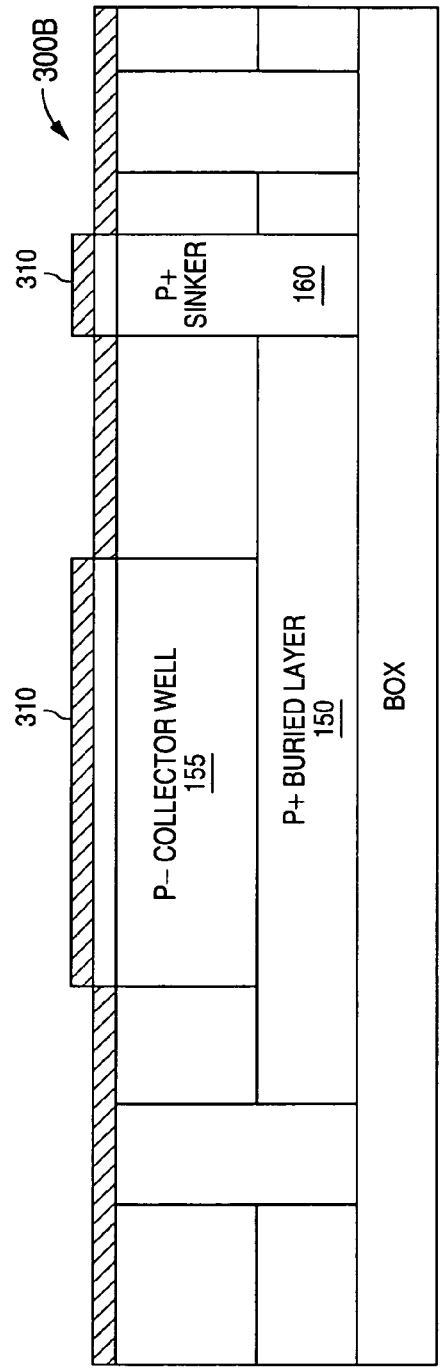
FIG. 3A
FIG. 3B

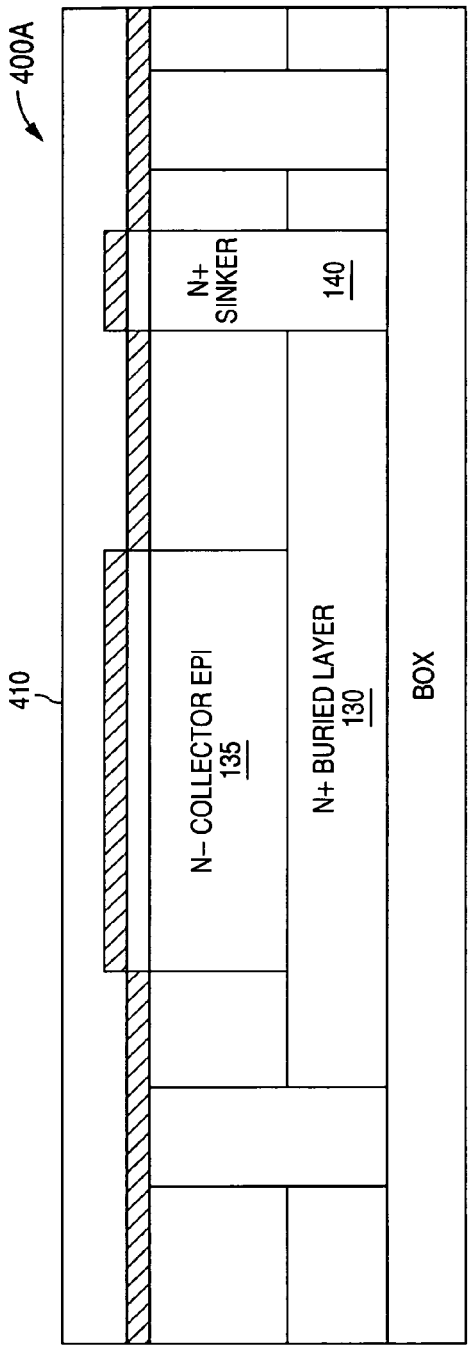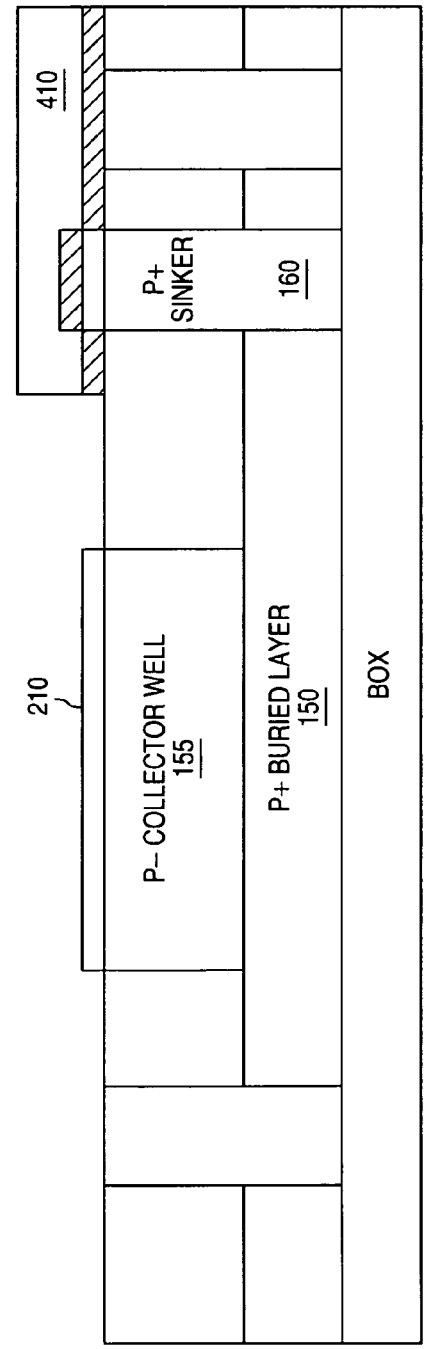
FIG. 4A
FIG. 4B

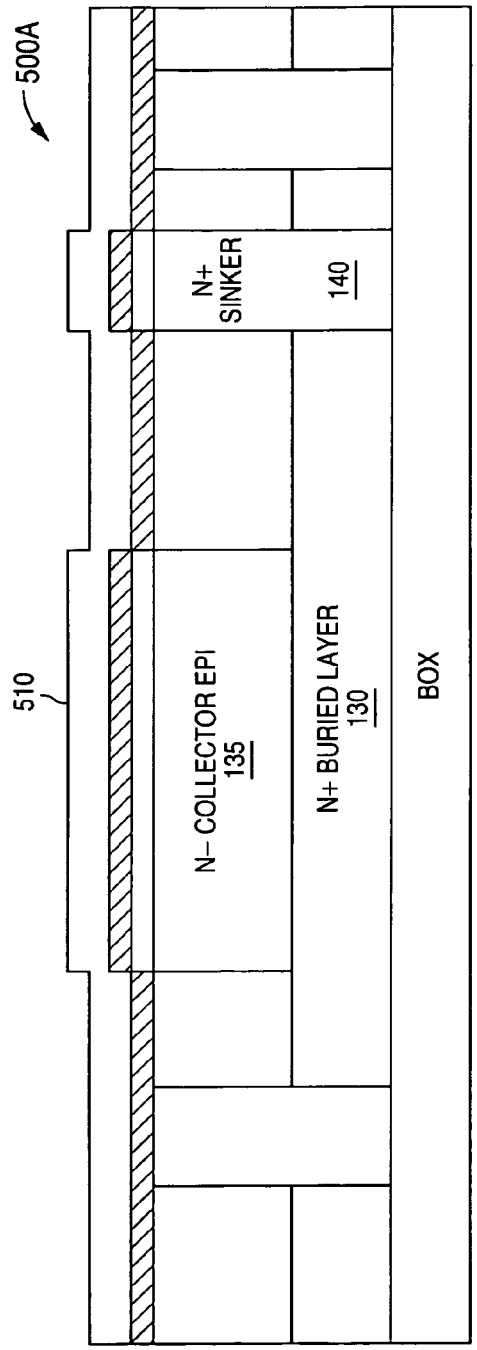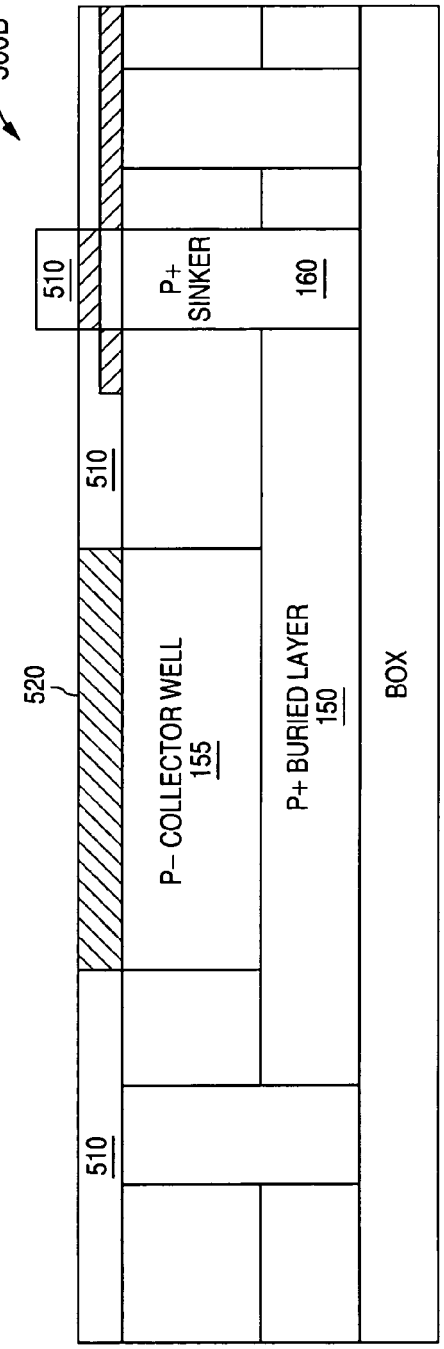
FIG. 5A
FIG. 5B

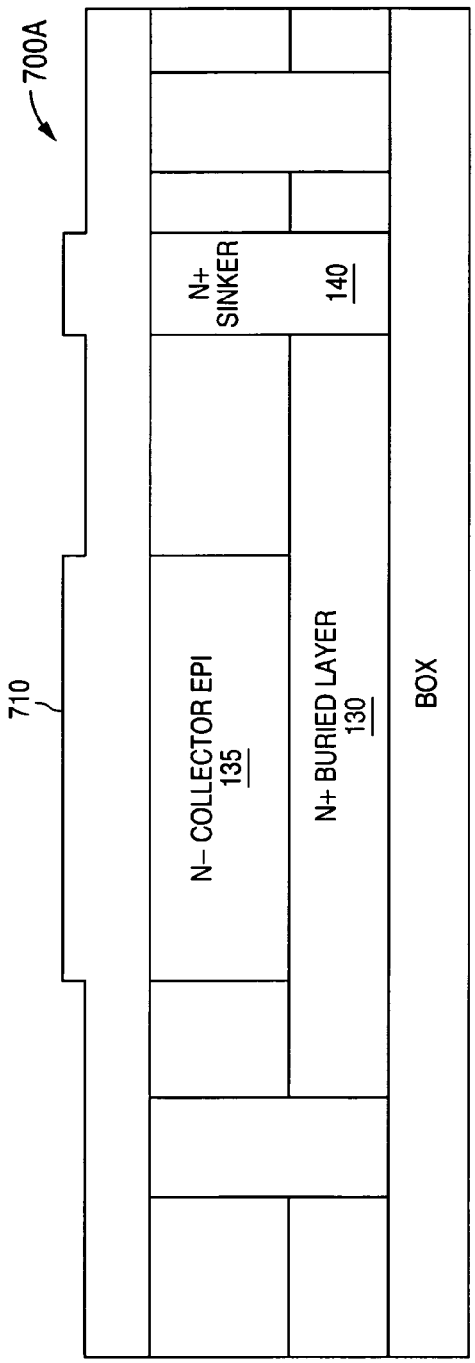
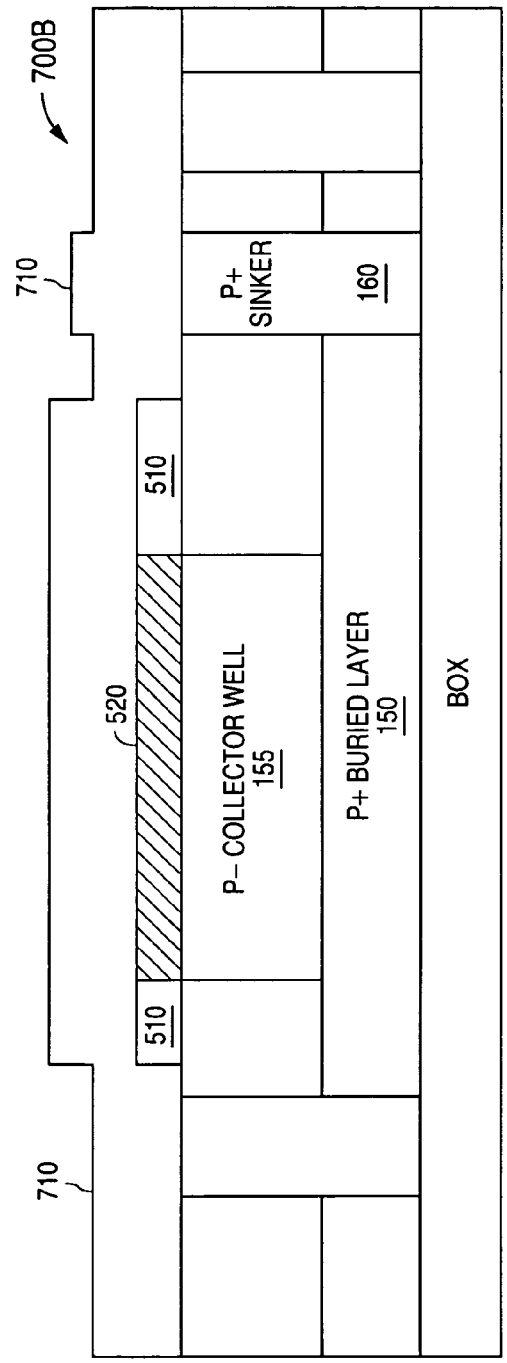
FIG. 7A
FIG. 7B

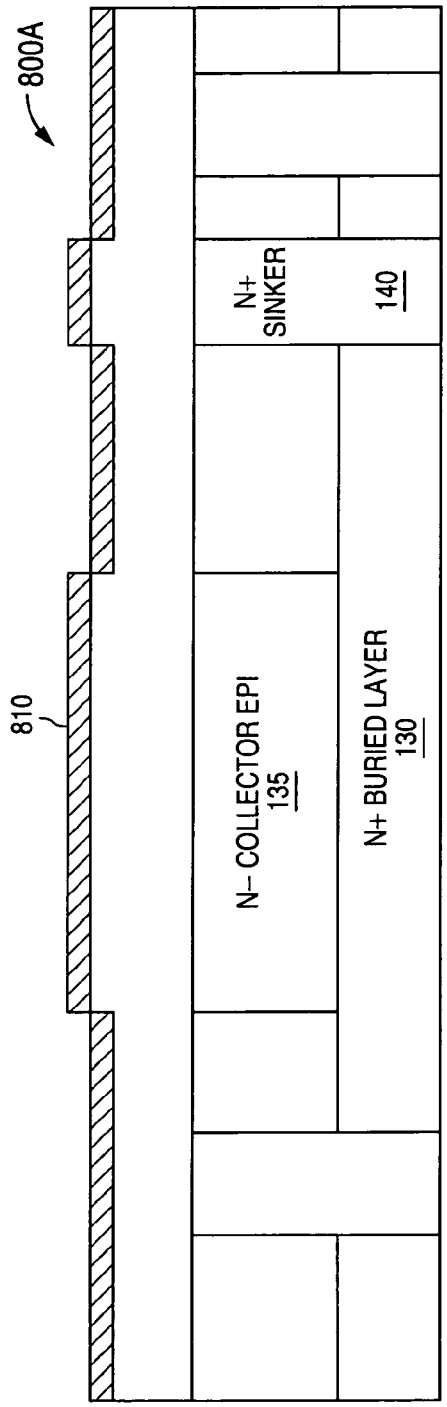
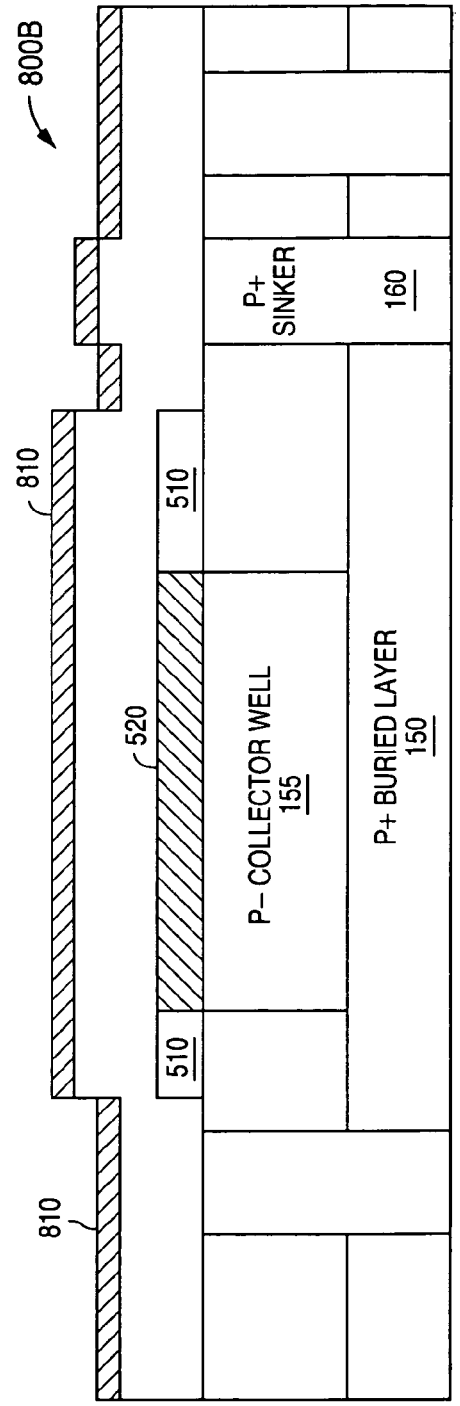
FIG. 8A
FIG. 8B

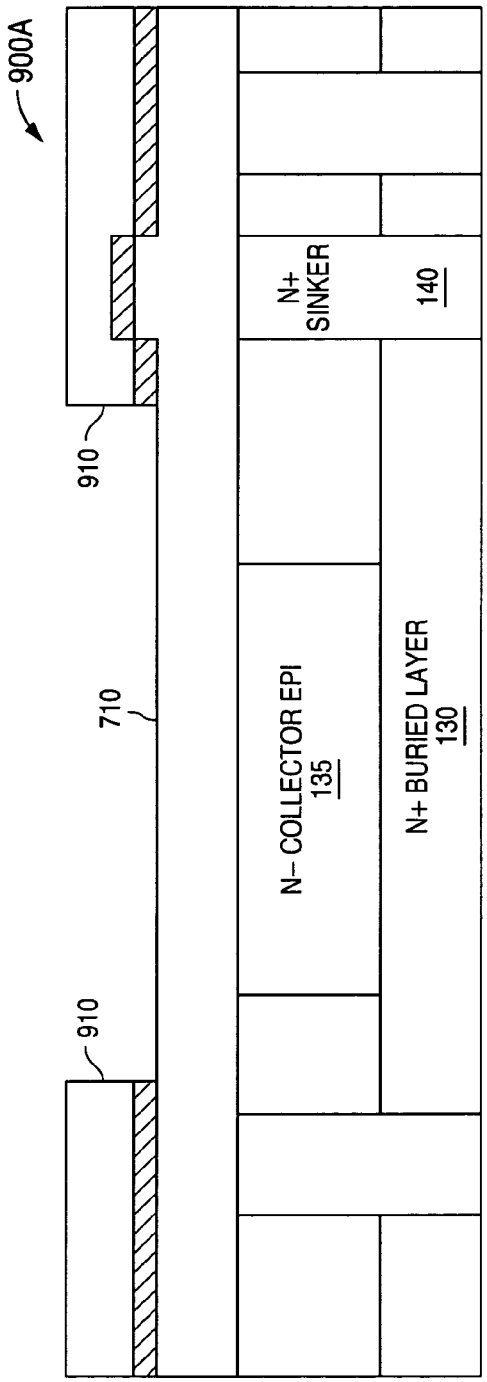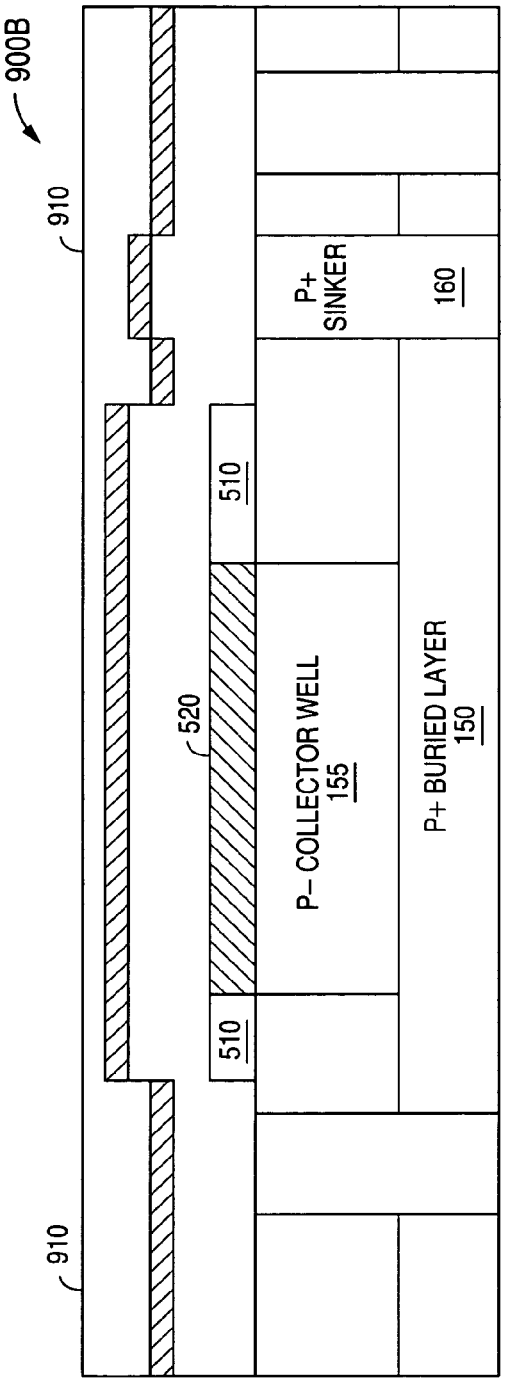
FIG. 9A
FIG. 9B

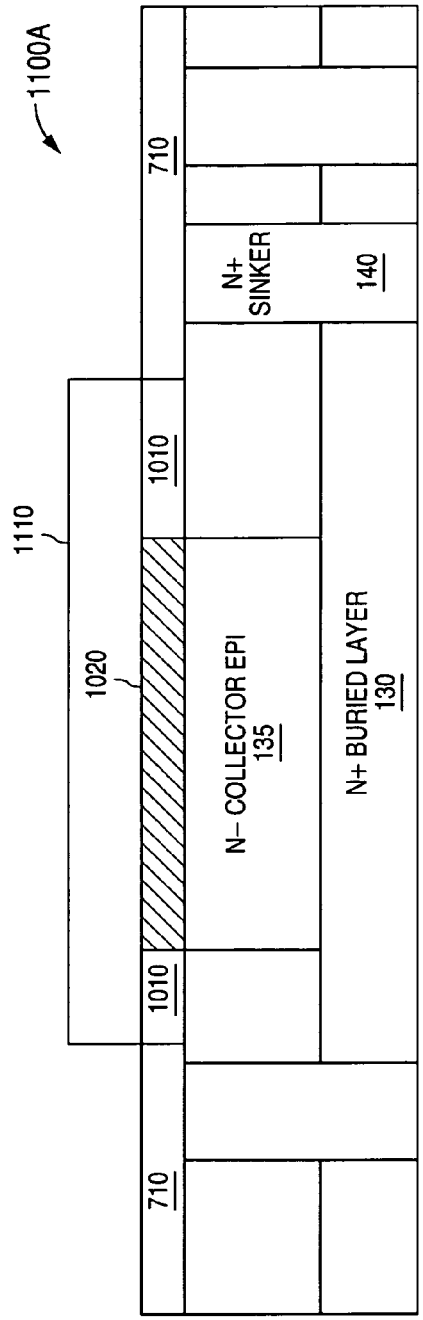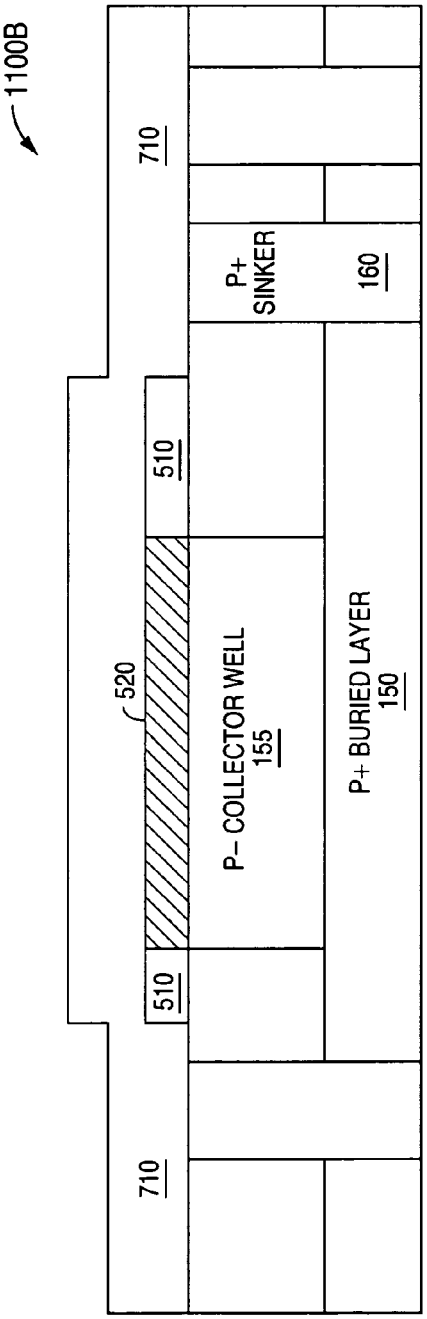
FIG. 11A
FIG. 11B

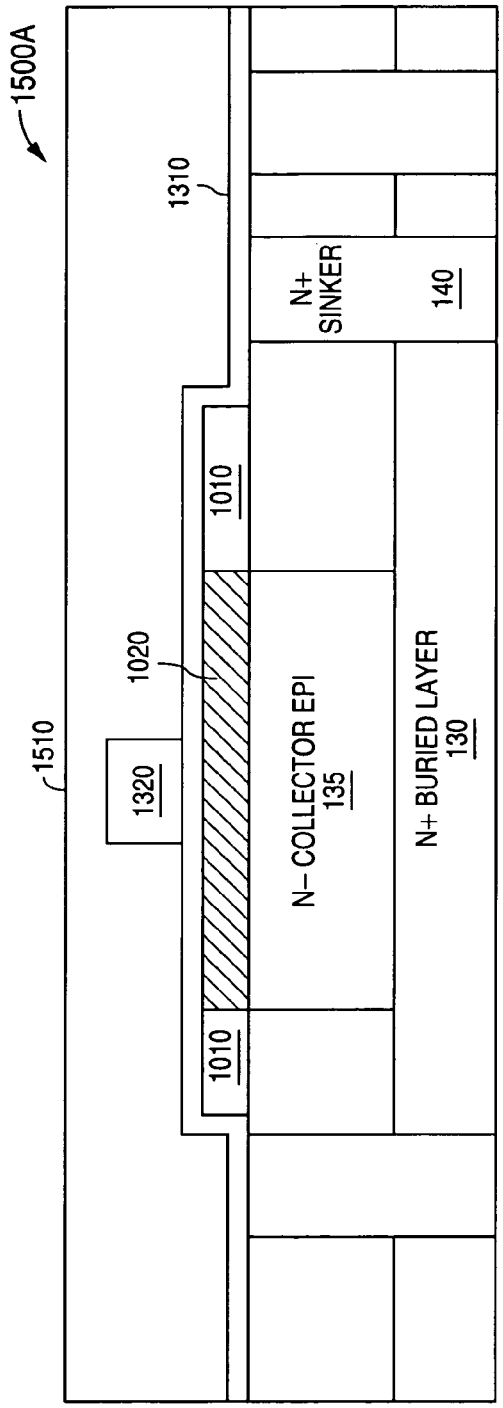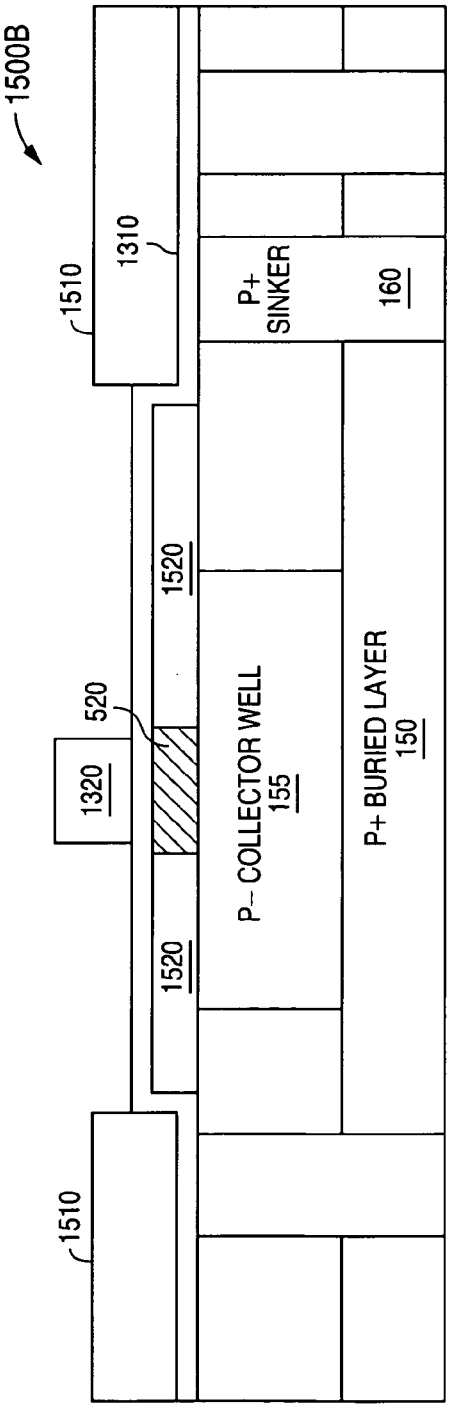
FIG. 15A
FIG. 15B

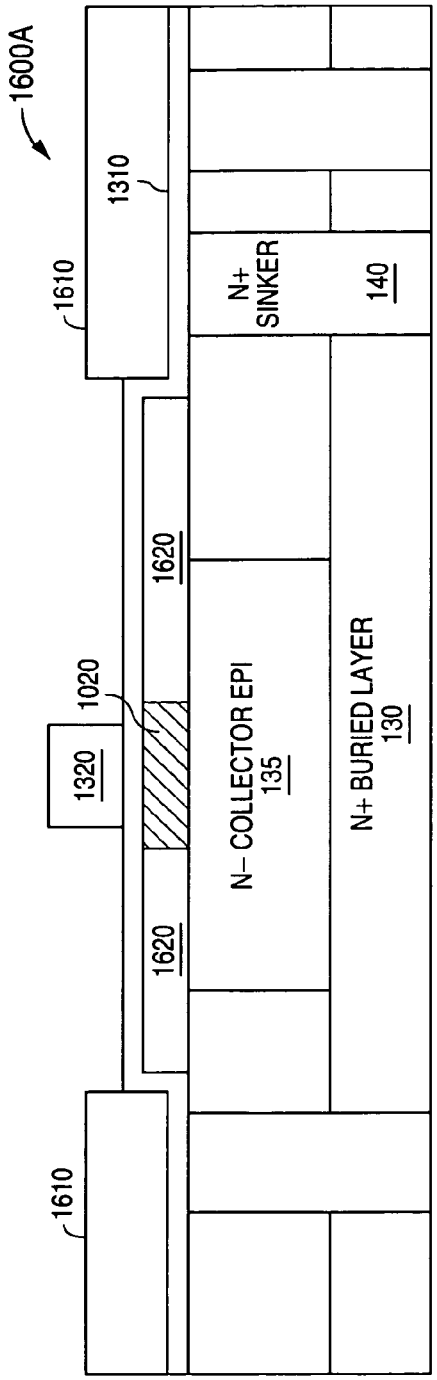
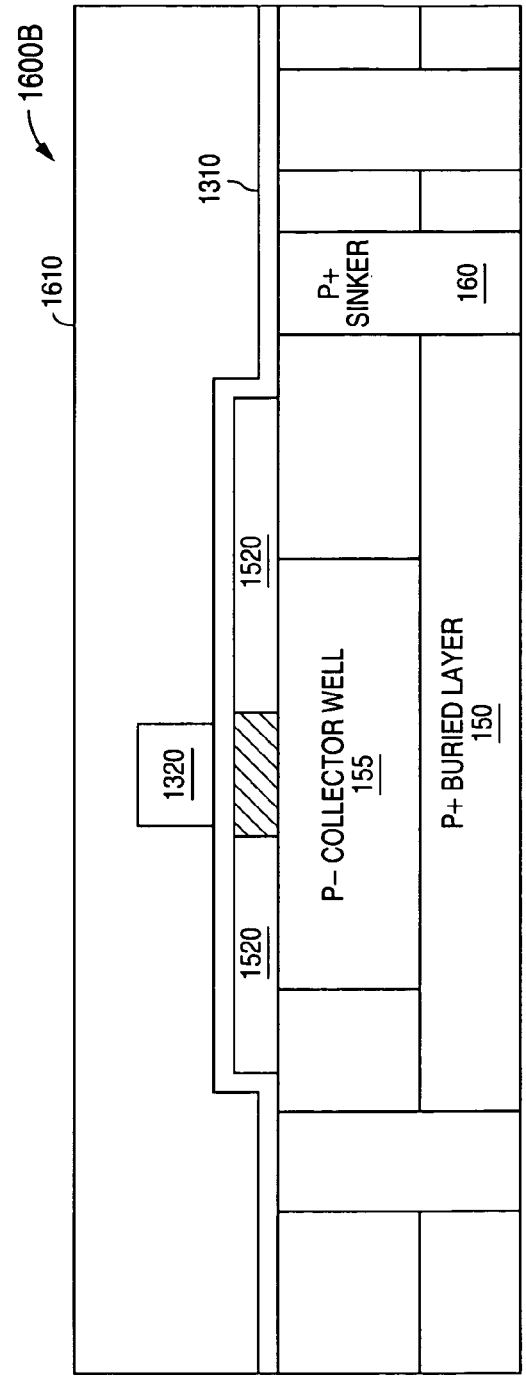
FIG. 16A
FIG. 16B

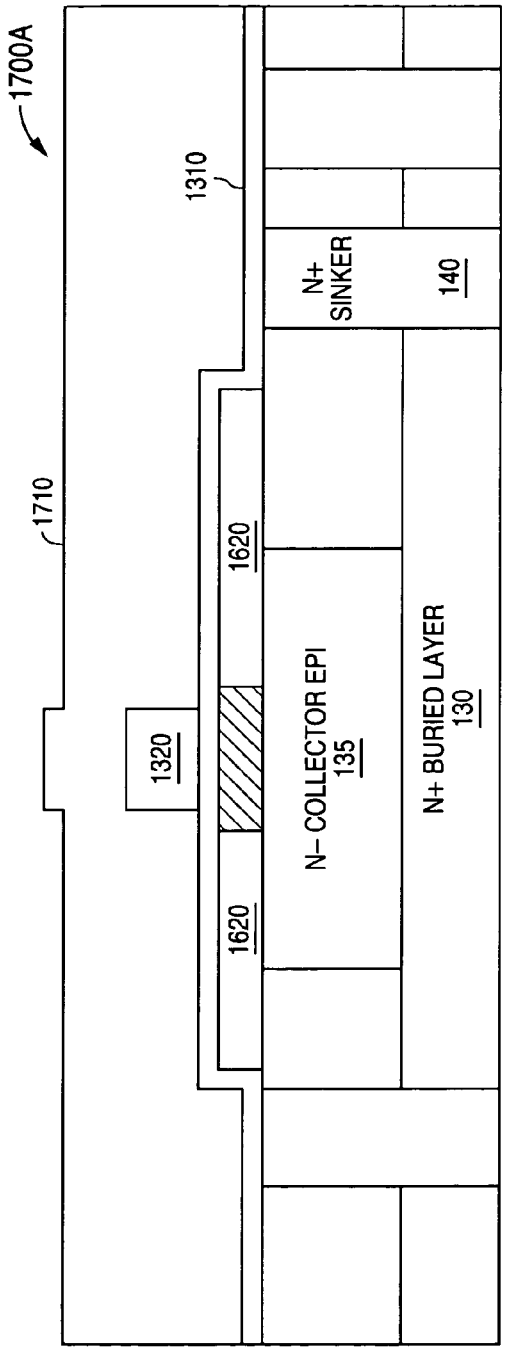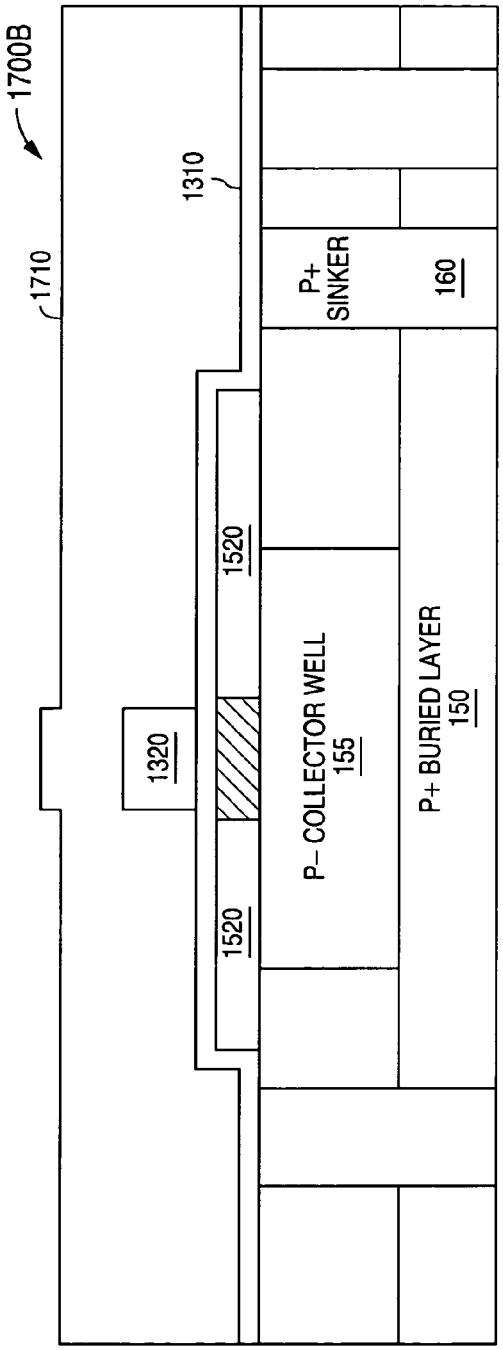
FIG. 17A
FIG. 17B

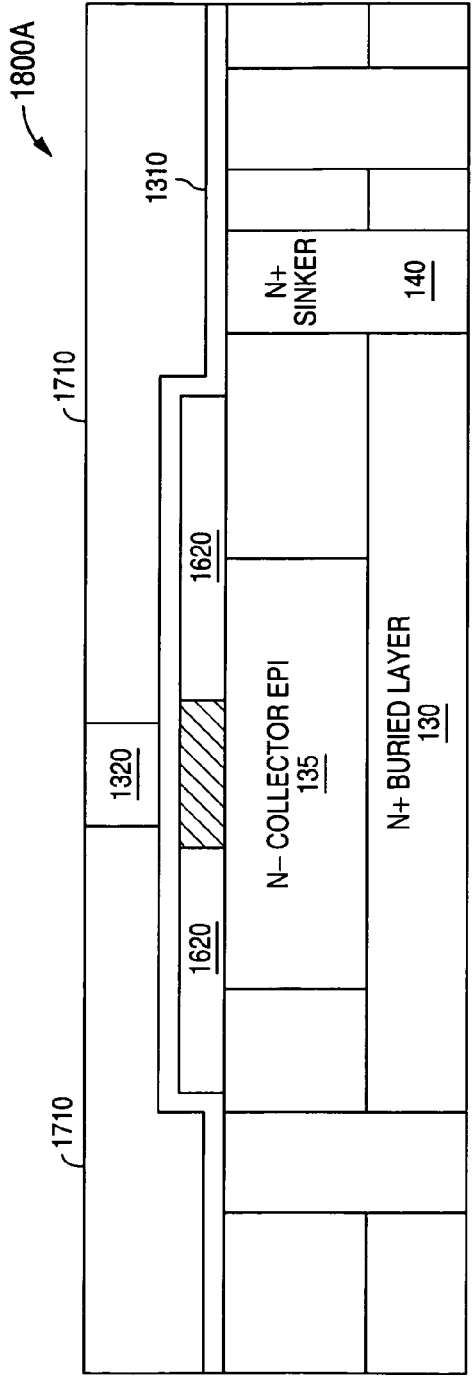
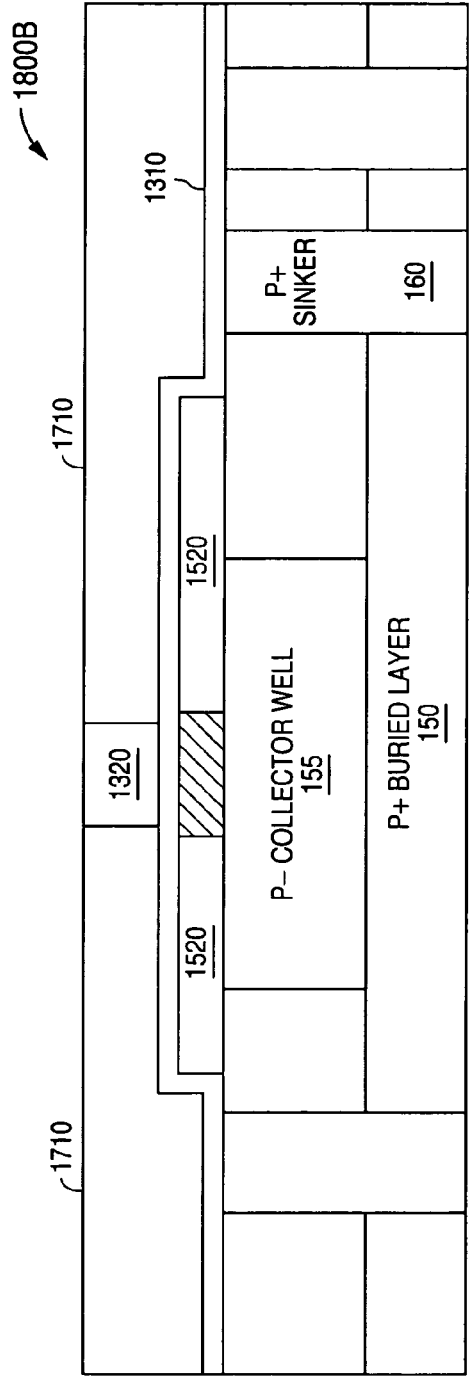
FIG. 18A
FIG. 18B

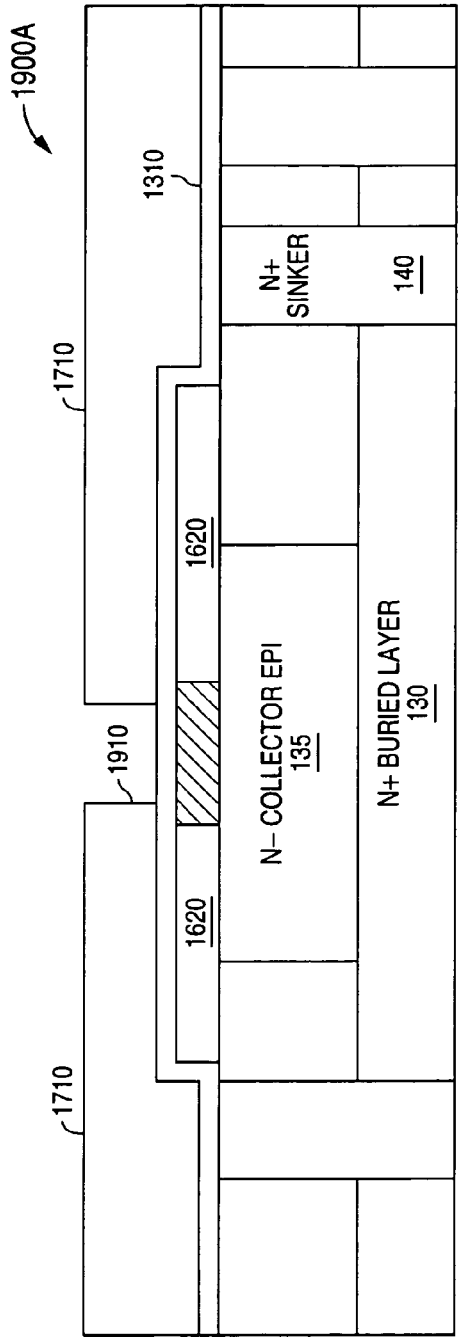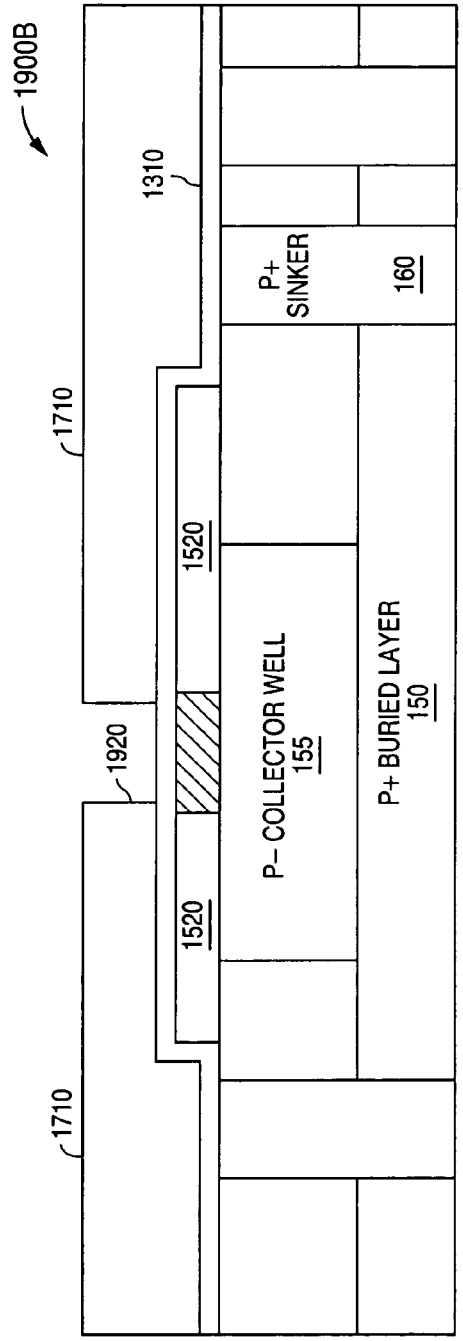

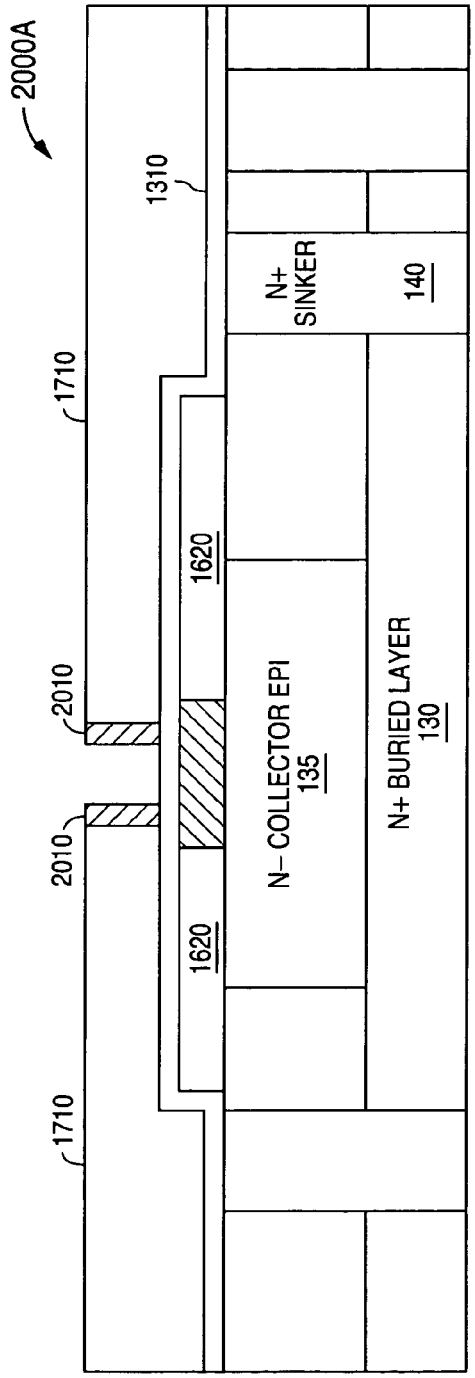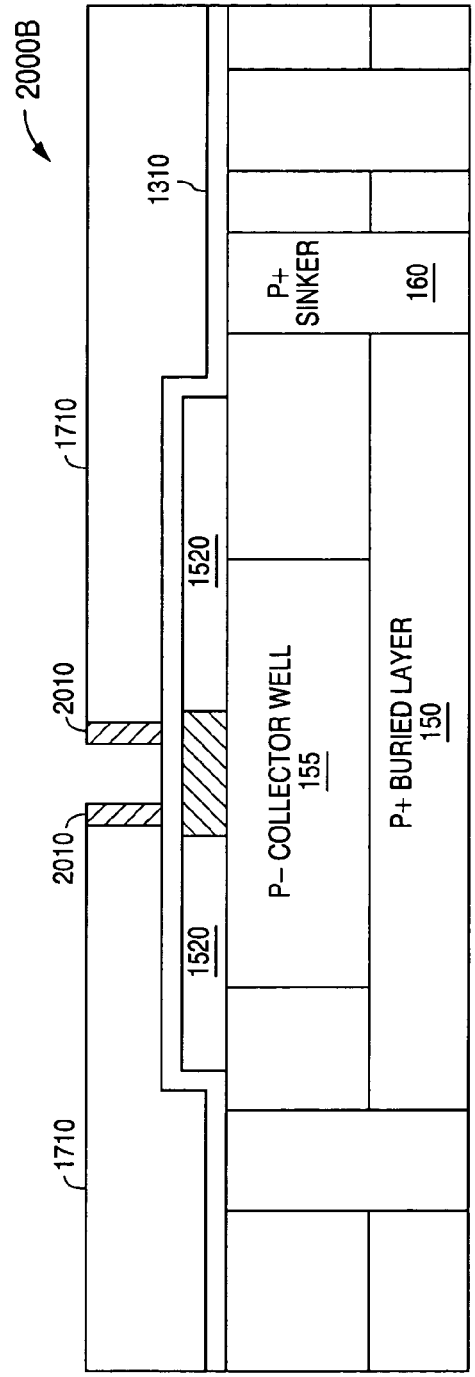

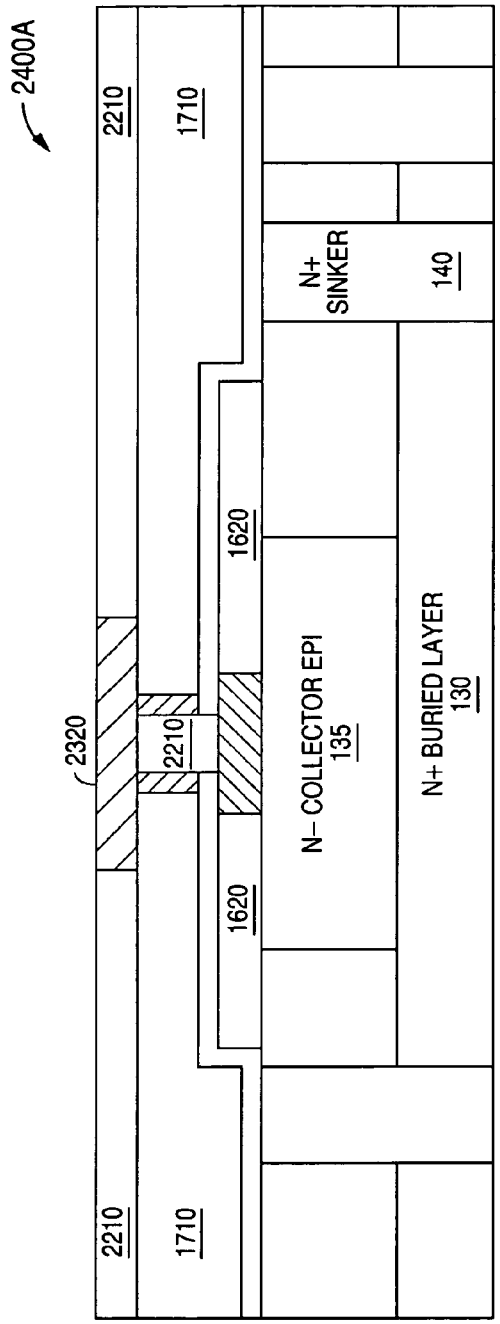
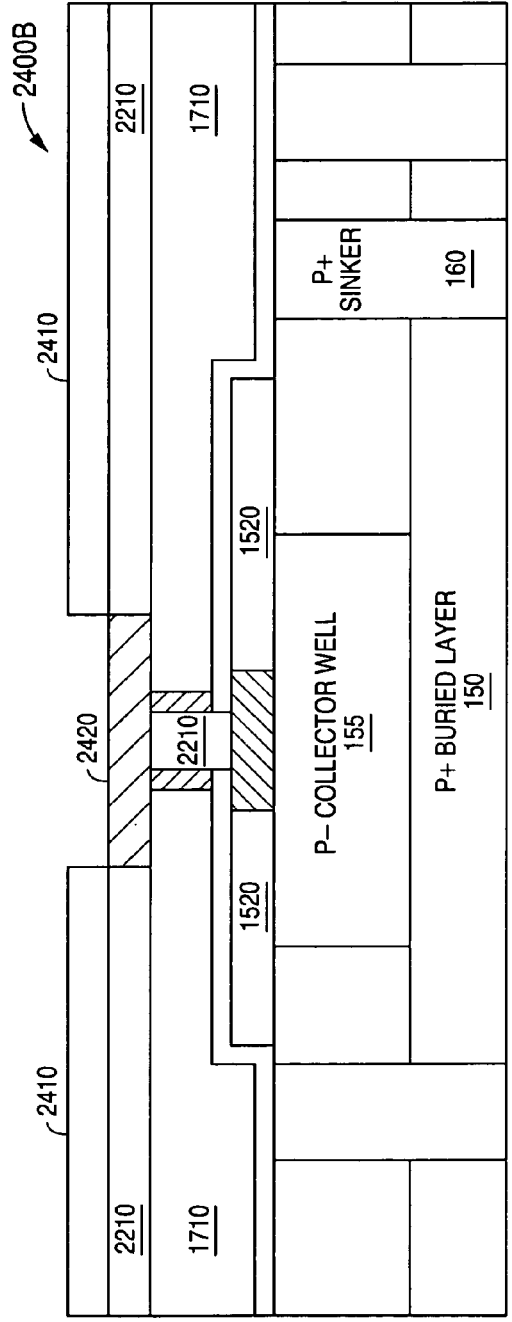
FIG. 24A
FIG. 24B

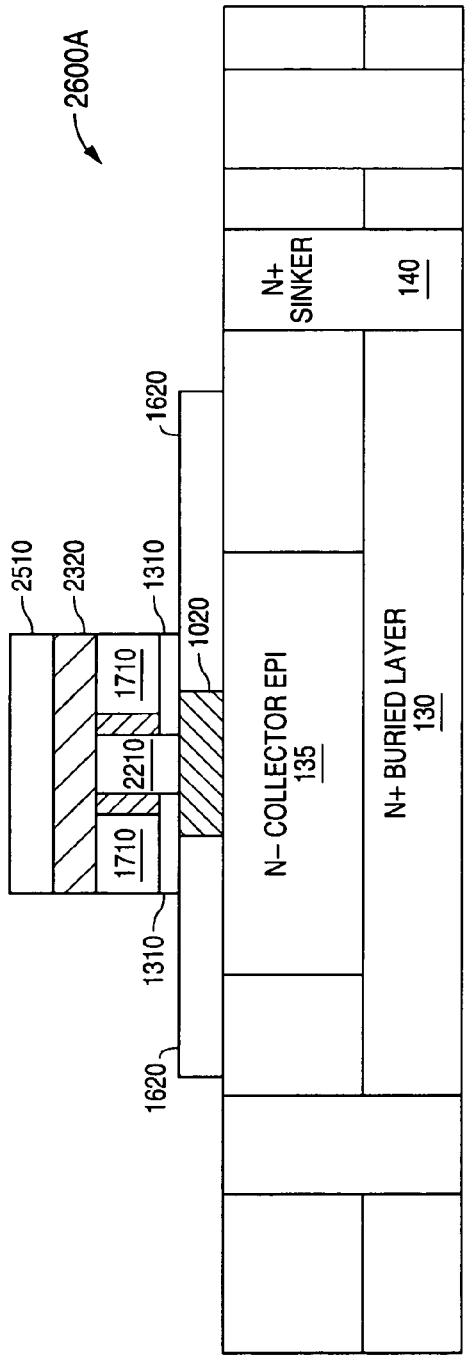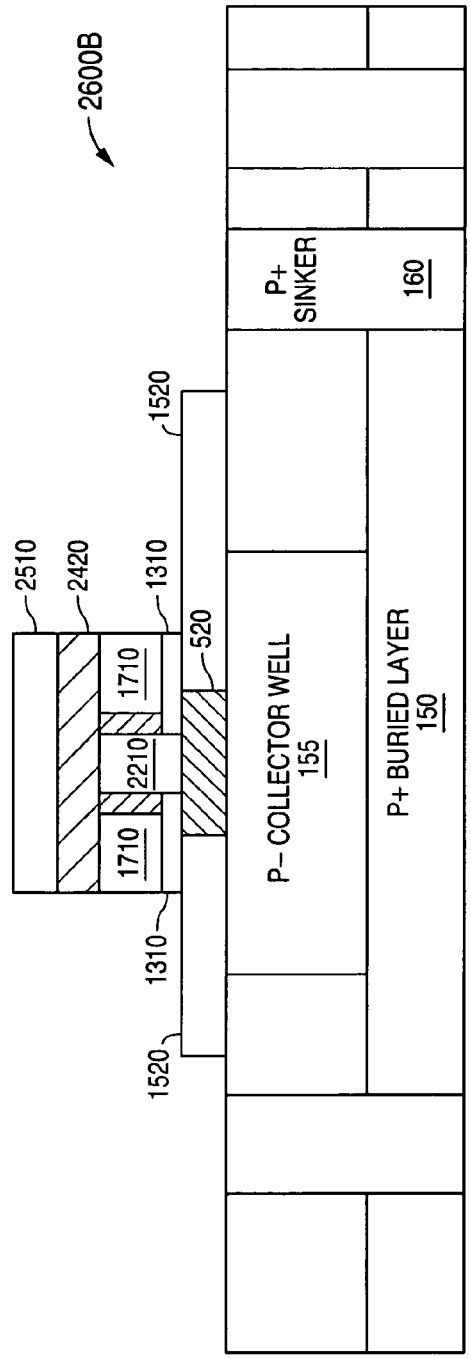
FIG. 26A
FIG. 26B

METHOD FOR MANUFACTURING BIPOLAR TRANSISTORS

TECHNICAL FIELD OF THE INVENTION

The present invention is generally directed to semiconductor technology and, in particular, to a method for manufacturing bipolar transistors.

BACKGROUND OF THE INVENTION

In recent years, there have been great advancements in the speed, power, and complexity of integrated circuits. Some integrated circuits comprise both PNP bipolar transistors and NPN bipolar transistors. The process for manufacturing bipolar transistors in an integrated circuit (sometimes referred to as a control flow process) involves the performance of a number of different types of manufacturing steps.

Most modern bipolar transistors have an intrinsic base and an extrinsic base. The intrinsic base is the actual electrically active base of the transistor. The extrinsic base is a heavily doped region to provide low resistance connection to the intrinsic base from the metal contact. In this way the relationship between the intrinsic base and the extrinsic base is similar to the relationship between the lightly doped drain and the heavily doped drain in modern metal oxide semiconductor (MOS) devices.

It is important that the emitter base junction occur in the extrinsic base. The heavy doping and damage in the extrinsic base can lead to junction leakage and low breakdown voltage. However, it is desirable to have the extrinsic base as close as possible to the emitter base junction in order to reduce the total lateral base resistance of the transistor.

This lateral base resistance is detrimental to the parametric performance of the transistor. Several methods exist to optimize the distance between the emitter base junction and the extrinsic base. One method is to use photolithography. The emitter is aligned to the extrinsic base using a photolithography tool such as a stepper, a step and scan system or a projection aligner.

However, there are several sources of error in this system. Both the emitter and the extrinsic base patterns are subject to variation in their sizes due to the photolithography and/or etch processes used to define them. If the emitter is too small or the extrinsic base too small, the base resistance will be too high. If the emitter is tool large or the extrinsic base is too large, the heavily doped and damaged extrinsic base can infringe on the emitter base junction leading to leakage and low breakdown voltage.

In addition to the size variation problem, there is a more serious problem due to the alignment of the extrinsic base to the emitter. If the extrinsic base is not centered on the emitter, it can lead to both the previously cited problems because the extrinsic base would be too close on one or more sides while being too far away on the opposite side or sides.

In general, alignment systems have approximately three times more variation in alignment error than in size error. The two most commonly applied methods of addressing this problem are to use a more precise stepper or to use a method that allows the extrinsic base to be aligned to the emitter base junction and better control of the respective structure sizes.

However, better alignment tools are very expensive. See, for example, page 2 of http://www.molecularimprints.com/NewsEvents/tech_articles/SPIE05 Molecular Imprints COO paper-final.pdf. Photolithographic tools for the 90 nm technology generation are estimated to cost twenty million dollars ($20,000,000). Photolithographic tools for the 65 nm technology generation are estimated to cost twenty five million dollars ($25,000,000).

The other alternative is to use a method of manufacturing that does not require alignment of the extrinsic base to the emitter base junction. One of the most prevalent methods of manufacturing advanced bipolar transistor devices is the Quasi Self Aligned method. However, this method aligns the extrinsic base to the emitter poly rather than to the emitter base junction and so does not solve the fundamental problem.

International Business Machines (IBM) has provided a self-aligned process which utilizes a local oxidation of silicon (LOCOS) process and a complex stack of oxide, nitride and poly to generate a self-aligned emitter window where the emitter intrinsic base would be formed. However, etching these complex stacks when patterning and removing them can be quite difficult. LOCOS, even with high pressure oxidation requires a high temperature and time. This combination of temperature and time causes undesired diffusion of the intrinsic base doping which in turn degrades the speed of the transistor.

There is a need in the art for an efficient method for manufacturing self-aligned PNP and NPN bipolar transistors that have very low thermal requirements. In particular, there is a need in the art for a method that is capable of efficiently manufacturing such PNP and NPN bipolar transistors in a unified control flow process. A unified control flow process is capable of manufacturing PNP bipolar transistors and NPN bipolar transistors in the same integrated circuit.

The present invention provides an efficient method for manufacturing NPN bipolar transistors and PNP bipolar transistors. An advantageous embodiment of the method of the invention for manufacturing a PNP transistor comprises the steps of forming a P type collector on a substrate, forming a PNP epitaxial base on the P type collector, forming a PNP extrinsic base in the PNP epitaxial base, and forming a PNP emitter in contact with the PNP extrinsic base.

An advantageous embodiment of the method of the invention for manufacturing an NPN transistor comprises the steps the steps of forming an N type collector on a substrate, forming a NPN epitaxial base on the N type collector, forming an NPN extrinsic base in the NPN epitaxial base, and forming an NPN emitter in contact with the NPN extrinsic base.

It is an object of the present invention to provide a method for efficiently manufacturing a self-aligned PNP transistor that has very low thermal requirements.

It is an object of the present invention to provide a method for efficiently manufacturing a self-aligned NPN transistor that has very low thermal requirements.

It is another object of the present invention to provide a method for efficiently combining the manufacturing steps for PNP transistors and the manufacturing steps for NPN transistors in a unified control flow process.

It is another object of present invention to manufacture PNP transistors and NPN transistors in a manner that minimizes the number of required manufacturing process steps.

It is another object of the present invention to provide a method for forming a PNP extrinsic base in a PNP epitaxial base and forming a PNP emitter in contact with the PNP extrinsic base.

It is another object of the present invention to provide a method for forming an NPN extrinsic base in an NPN epitaxial base and forming an NPN emitter in contact with the NPN extrinsic base.

The foregoing has outlined rather broadly the features and technical advantages of the present invention so that those persons who are skilled in the art may better understand the detailed description of the invention that follows. Additional features and advantages of the invention will be described hereinafter that form the subject of the claims of the invention. Persons who are skilled in the art should appreciate that they may readily use the conception and the specific embodiment disclosed as a basis for modifying or designing other structures for carrying out the same purposes of the present invention. Persons who are skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those persons of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIGS. 1A through 27A illustrate successive stages of a manufacturing method of the present invention for manufacturing an NPN bipolar transistor;

FIGS. 1B through 27B illustrate successive stages of a manufacturing method of the present invention for manufacturing a PNP bipolar transistor;

DETAILED DESCRIPTION OF THE INVENTION

Figure 6A:
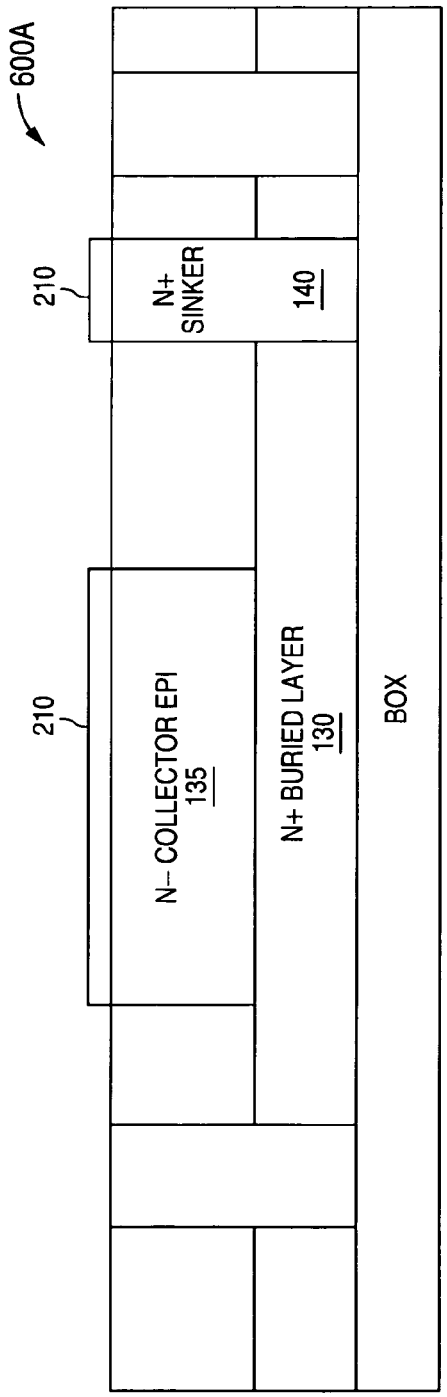
Figure 6B:
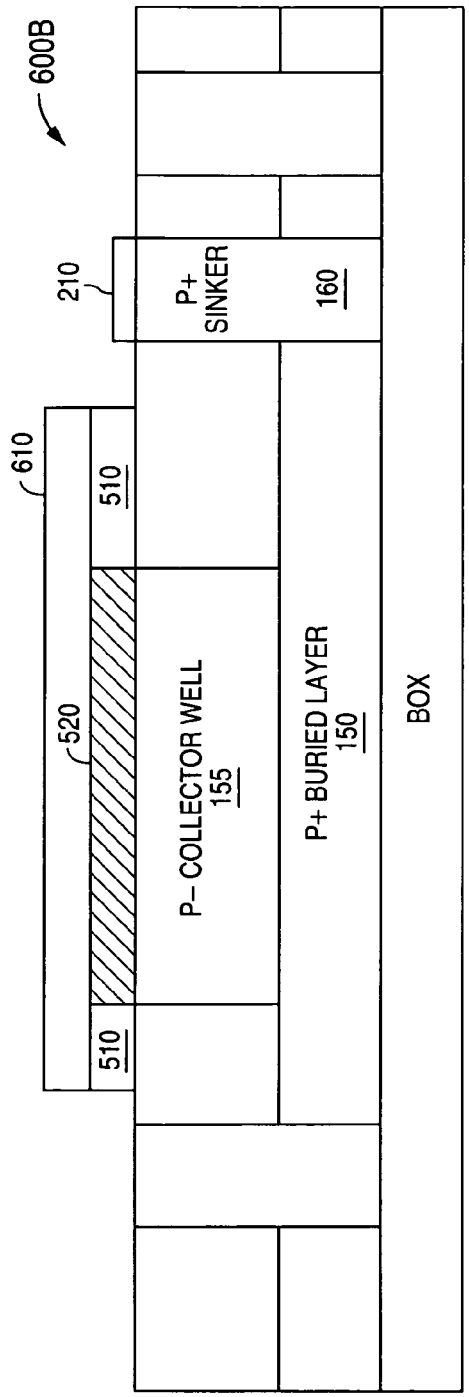

FIGS. 1A through 29, discussed below, and the various embodiments used to describe the principles of the present invention in this patent document are by way of illustration only and should not be construed in any way to limit the scope of the invention. Persons who are skilled in the art will understand that the principles of the present invention may be implemented in any type of suitably arranged semiconductor device.

FIG. 1A illustrates a semiconductor structure 100A from which an NPN transistor may be manufactured in accordance with the principles of the present invention. The foundation of structure 100A comprises a buried oxide (Box) substrate 110 on which an N+ buried layer 130 is formed. A P− active silicon layer 115 is formed on the buried oxide (Box) substrate 110. In an advantageous embodiment of the invention the thickness of the P− active silicon layer 115 is approximately two microns (2.0µ) and the thickness of the N+ buried layer 130 is approximately two and one half microns (2.5µ).

The P− active silicon layer 115 and the N+ buried layer 130 are isolated by a silicon on insulator (SOI) isolation architecture. The isolation is provided by an oxide filled shallow trench isolation (STI) layer 120 (for isolation within the transistor) and an oxide filled deep trench isolation (DTI) layer 125 (for transistor to transistor isolation).

The NPN bipolar transistor that will be more fully described in this patent document can also be isolated by other types of isolation architectures such as junction isolation and/or local oxidation of silicon (LOCOS). Other types of isolation architectures may also be used.

The manufacturing method of the present invention begins after the formation of the buried layer and the collector tub. In an advantageous embodiment of the method of the present invention, an epi of one doping type is grown over the buried layer and areas for the opposite type transistor are masked and counter doped. The structure 100A is formed with an N− collector epi layer 135. In an advantageous embodiment of the invention the thickness of the N− collector epi layer 135 is approximately one micron (1.0µ).

Persons who are skilled in the art will recognize that an undoped epi (not shown) with two masked and doped collector tubs (not shown) could have been used. Further, persons who are skilled in the art will recognize (1) that N+ buried layer 130 could be formed without epi using high energy implantation or (2) that selective collectors could be used in place of the N− collector epi 135 shown in FIG. 1A.

In an advantageous embodiment of the method of the present invention, an N+ sinker 140 is formed to reach N+ buried layer 130. Persons who are skilled in the art will recognize that the N+ sinker 140 is an optional feature.

FIG. 1B illustrates a semiconductor structure 100B from which a PNP transistor may be manufactured in accordance with the principles of the present invention. The foundation of structure 100B comprises a buried oxide (Box) substrate 110 on which a P+ buried layer 150 is formed. A P− active silicon layer 115 is formed on the buried oxide (Box) substrate 110. In an advantageous embodiment of the invention the thickness of the P− active silicon layer 115 is approximately two microns (2.0µ) and the thickness of the P+ buried layer 150 is approximately two microns (2.0µ).

The P− active silicon layer 115 and the P+ buried layer 150 are isolated by a silicon on insulator (SOI) isolation architecture. The isolation is provided by an oxide filled shallow trench isolation (STI) layer 120 (for isolation within the transistor) and an oxide filled deep trench isolation (DTI) layer 125 (for transistor to transistor isolation).

The PNP bipolar transistor that will be more fully described in this patent document can also be isolated by other types of isolation architectures such as junction isolation and/or local oxidation of silicon (LOCOS). Other types of isolation architectures may also be used.

The manufacturing method of the present invention begins after the formation of the buried layer and the collector tub. In an advantageous embodiment of the method of the present invention, an epi of one doping type is grown over the buried layer and areas for the opposite type transistor are masked and counter doped. The structure 100B is formed with a P− collector well 155. Persons who are skilled in the art will recognize that an undoped epi (not shown) with two masked and doped collector tubs (not shown) could have been used. Further, persons who are skilled in the art will recognize (1) that P+ buried layer 150 could be formed without epi using high energy implantation or (2) that selective collectors could be used in place of the P− collector well 155 shown in FIG. 1B.

In an advantageous embodiment of the method of the present invention, a P+ sinker 160 is formed to reach P+ buried layer 150. Persons who are skilled in the art will recognize that the P+ sinker 160 is an optional feature.

The steps of the manufacturing method of the present invention will be described for an NPN bipolar transistor semiconductor device and a PNP bipolar transistor semiconductor device. Although the two semiconductor devices are shown separately in FIG. 1A and in FIG. 1B, the two semiconductor devices may both be located on and manufactured on the same substrate 110.

In the initial step of the method of the invention a thin layer of oxide 210 is placed over the active silicon regions (N− collector epi 135, N+ sinker 140, P− collector well 155, and P+ sinker 160). In an advantageous embodiment of the method the oxide layer 210 is grown thermally. In an advantageous embodiment of the invention the thickness of the oxide layer 210 is approximately two hundred Angstroms (200 Å). The resulting structures (200A and 200B) are shown in FIG. 2A and in FIG. 2B. Beginning with FIG. 2A and FIG. 2B some reference numerals will not be repeated for elements that have been previously identified.

Persons who are skilled in the art will recognize that the oxide layer 210 could alternately be deposited with low pressure chemical vapor deposition (LPCVD) or plasma enhanced chemical vapor deposition (PECVD). Alternatively, the oxide layer 210 could be left on the active silicon regions from an earlier operation. For example, the pad oxide under a nitride oxidation block layer for LOCOS isolation or the pad oxide under a nitride chemical mechanical polishing (CMP) stop for shallow trench isolation. In the case of LPCVD or PECVD the oxide layer 210 is formed on all surfaces of the wafer simultaneously.

In an advantageous embodiment of the method a layer of polysilicon 310 is deposited over the thin oxide layer 210 (and over other portions of the wafer) in order to improve the subsequent deposition of an epitaxial base. In an advantageous embodiment of the invention the thickness of the layer of polysilicon 310 is approximately five hundred Angstroms (500 Å). The resulting structures (300A and 300B) are shown in FIG. 3A and in FIG. 3B. Persons who are skilled in the art will recognize that the deposition of the layer of polysilicon 310 is an optional feature.

In the following description of the advantageous embodiment of the method of the invention non-selective epitaxial bases will be deposited. Persons who are skilled in the art will recognize that selective epitaxial bases could be deposited for the NPN transistor or the PNP transistor. If selective epitaxial bases are used, then the layer of polysilicon 310 would not be deposited prior to the selective epitaxial base deposition.

The method of the present invention is designed to manufacture NPN transistors and PNP transistors in the same control flow process. If the NPN transistors and the PNP transistors were being manufactured separately there would be no need to apply the thin oxide layer 210 or the layer of polysilicon 310.

In the next step of the manufacturing method of the invention a photoresist layer 410 is placed over the wafer. Portions of the photoresist layer 410 are then selectively removed from the base/emitter active silicon region of the PNP transistor. Then the exposed portions of the layer of polysilicon 310 are etched in the area where the photoresist layer 410 has been removed with the etch stopping on the underlying oxide layer 210. The resulting structures (400A and 400B) are shown in FIG. 4A and in FIG. 4B.

In the next step of the manufacturing method of the invention the remaining portions of the photoresist layer 410 are removed and the exposed portions of oxide layer 210 on the PNP transistor are removed. In an advantageous embodiment of the method of the invention the exposed portions of oxide layer 210 are removed in a wet media immediately prior to the epitaxial base deposition. Persons who are skilled in the art will recognize that with the proper pre-epitaxial treatment, the portions of oxide layer 210 could also be removed in other ways. For example, the portions of oxide layer 210 could be removed in a dry etch along with the polysilicon layer 310 or in a wet etch not immediately prior to the epitaxial base deposition.

In the next step of the manufacturing method of the invention the first epitaxial base is created. In an advantageous embodiment of the method of the invention a silicon germanium (SiGe) epitaxial layer 510 is deposited. The first epitaxial base 520 is formed over the P− collector well 155 by in-situ doping the silicon germanium (SiGe) epitaxial layer 510 with arsenic (As). The resulting structures (500A and 500B) are shown in FIG. 5A and in FIG. 5B.

Persons who are skilled in the art will recognize that the epitaxial base 520 could be in-situ doped silicon (Si) (instead of silicon germanium (SiGe)) and that the epitaxial base 520 could be doped with phosphorus (P) or with antimony (Sb) or with arsenic (As). Persons who are skilled in the art will also recognize that in the case of phosphorus, the silicon (Si) or silicon germanium (SiGe) could also be doped with carbon to reduce diffusion of the base dopant.

Persons who are skilled in the art will also recognize that the NPN base could have been deposited first, either with silicon (Si) or silicon germanium (SiGe) and in-situ doped with boron (B) or indium (In) (with or without carbon).

In the next step of the manufacturing method of the invention a photoresist layer 610 is placed over the wafer. Portions of the photoresist layer 610 are selectively removed from all but the base/emitter active silicon region over the PNP transistor (i.e., first epitaxial base 520). The exposed portions of the epitaxial base layer 510 and the underlying layer of polysilicon 310 are then selectively etched where the photoresist layer 610 has been removed with the etch stopping on the underlying oxide layer 210. The resulting structures (600A and 600B) are shown in FIG. 6A and in FIG. 6B. The remaining portion of the photoresist layer 610 is then removed.

If only a PNP transistor is to be formed then the following steps for forming an NPN transistor are skipped. The next step for forming the remainder of the PNP transistor begins with the step associated with FIG. 13B.

If an NPN transistor is also to be formed then the next step in the method begins with the step associated with FIG. 7A and FIG. 7B. In this advantageous embodiment of the invention the NPN transistor will also be formed with an epitaxial base. Persons who are skilled in the art will recognize that either a PNP transistor or an NPN transistor could be formed with a non-epitaxial base.

In order to form the NPN transistor, in the next step of the manufacturing method of the invention an oxide layer 710 is formed over the epitaxial base 520. In an advantageous embodiment of the invention the thickness of the oxide layer 710 is approximately two hundred Angstroms (200 Å). The resulting structures (700A and 700B) are shown in FIG. 7A and in FIG. 7B. In an advantageous embodiment of the method of the invention the oxide layer 710 is deposited by plasma enhanced chemical vapor deposition (PECVD).

Persons who are skilled in the art will recognize that the oxide layer 710 could also be thermally grown or deposited with low pressure chemical vapor deposition (LPCVD). In the case of PECVD and LPCVD the oxide layer 710 is formed simultaneously on all surfaces of the wafer.

In the next step of the manufacturing method of the invention a layer of polysilicon 810 is deposited over the oxide layer 710 to improved the subsequent deposition of an epitaxial base. In an advantageous embodiment of the invention the thickness of the layer of polysilicon 810 is approximately five hundred Angstroms (500 Å). The resulting structures (800A and 800B) are shown in FIG. 8A and in FIG. 8B. From this point on the underlying substrate 110 will not be shown in the drawings. Persons who are skilled in the art will recognize that layer of polysilicon 810 is optional.

In the following description of the advantageous embodiment of the method of the invention non-selective epitaxial bases will be deposited. Persons who are skilled in the art will recognize that selective epitaxial bases could be deposited for the NPN transistor or the PNP transistor. If selective epitaxial bases are used, then the layer of polysilicon 810 would not be deposited prior to the selective epitaxial base deposition.

In the next step of the manufacturing method of the invention a photoresist layer 910 is placed over the wafer. Portions of the photoresist layer 910 are then selectively removed from the base/emitter active silicon region of the NPN transistor. Then the exposed portions of the layer of polysilicon 810 are etched in the area where the photoresist layer 910 has been removed with the etch stopping on the underlying oxide layer 710. The resulting structures (900A and 900B) are shown in FIG. 9A and in FIG. 9B.

In the next step of the manufacturing method of the invention the remaining portions of the photoresist layer 910 are removed and the exposed portions of oxide layer 710 on the NPN transistor are removed. In an advantageous embodiment of the method of the invention the exposed portions of oxide layer 710 are removed in a wet media immediately prior to the epitaxial base deposition. Persons who are skilled in the art will recognize that with the proper pre-epitaxial treatment, the portions of oxide layer 710 could also be removed in other ways. For example, the portions of oxide layer 710 could be removed in a dry etch along with the polysilicon layer 810 or in a wet etch not immediately prior to the epitaxial base deposition.

Figure 10A:
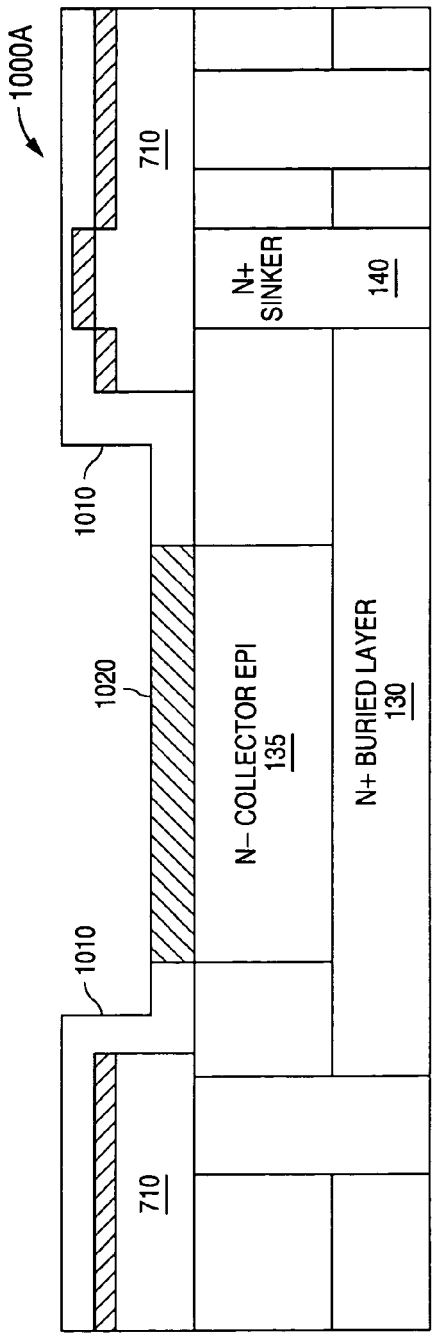
Figure 10B:
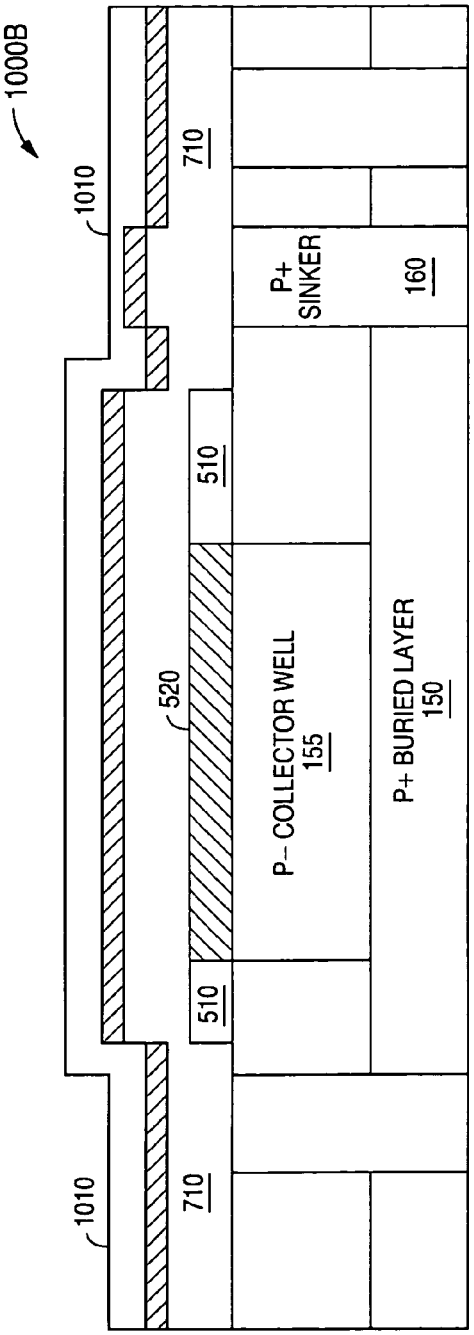

In the next step of the manufacturing method of the invention the second epitaxial base is created. In an advantageous embodiment of the method of the invention a silicon germanium carbon (SiGeC) epitaxial layer 1010 is deposited. The second epitaxial base 1020 is formed over the N− collector epi 135 by in-situ doping the silicon germanium carbon (SiGeC) epitaxial layer 1010 with boron (B). The resulting structures (1000A and 1000B) are shown in FIG. 10A and in FIG. 10B.

Persons who are skilled in the art will recognize that the epitaxial base 1020 could be in-situ doped silicon (Si) (instead of silicon germanium carbon (SiGeC)) and that the epitaxial base 1020 could be doped with indium (In). Persons who are skilled in the art will also recognize that either the silicon (Si) or the silicon germanium carbon (SiGeC) epitaxial base 1020 could be formed without carbon.

In the next step of the manufacturing method of the invention a photoresist layer 1110 is placed over the wafer. Portions of the photoresist layer 1110 are selectively removed from all but the base/emitter active silicon region over the NPN transistor (i.e., second epitaxial base 1020). The exposed portions of the epitaxial base layer 1010 and the underlying layer of polysilicon 810 are then selectively etched where the photoresist layer 1110 has been removed with the etch stopping on the underlying oxide layer 710. The resulting structures (1100A and 1100B) are shown in FIG. 11A and in FIG. 11B.

Figure 12A:
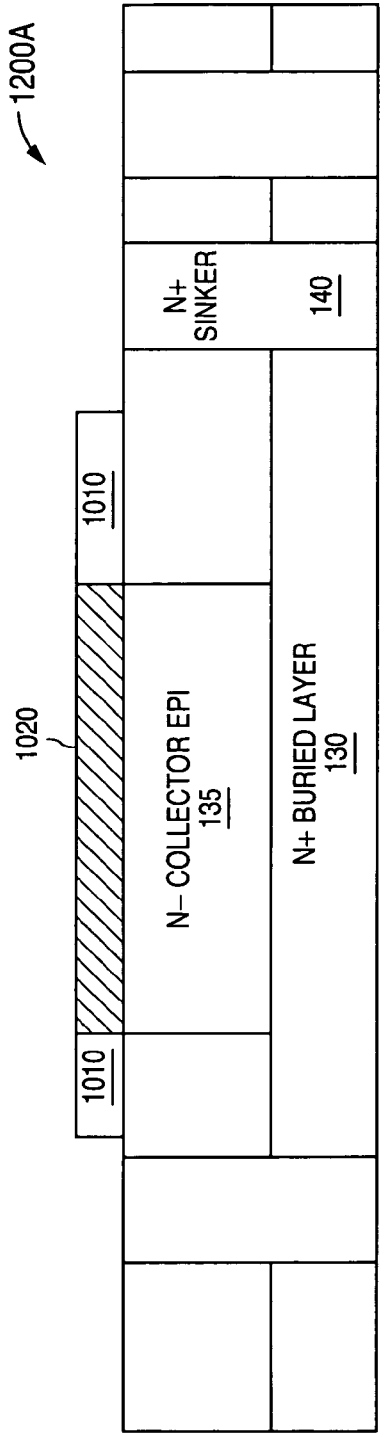
Figure 12B:
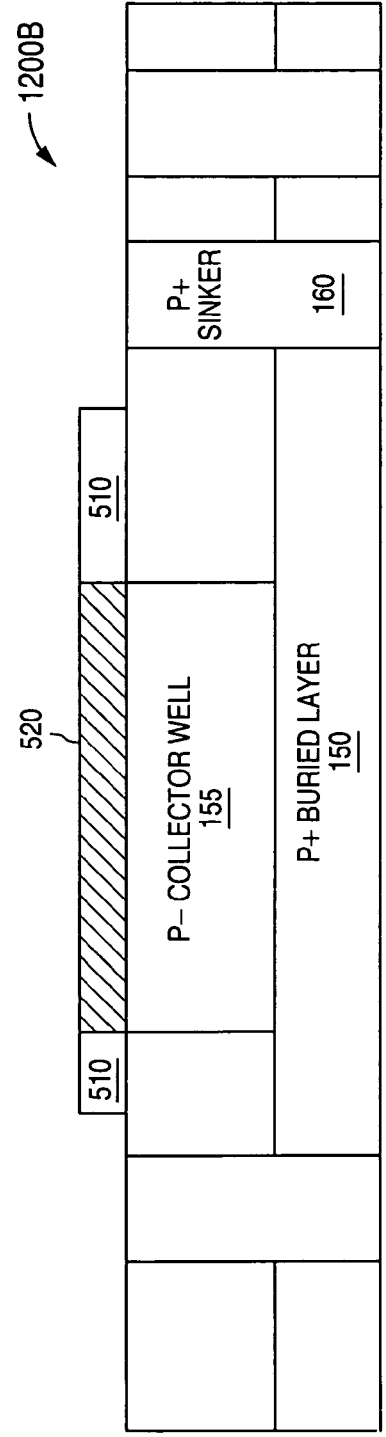

Then the remaining portion of the photoresist layer 1110 is removed. Then the oxide layer 710 is etched away. The resulting structures (1200A and 1200B) are shown in FIG. 12A and in FIG. 12B.

In the next step of the manufacturing method of the invention an oxide layer 1310 is formed over the wafer. In an advantageous embodiment of the invention the thickness of the oxide layer 1310 is approximately two hundred Angstroms (200 Å). In an advantageous embodiment of the method of the invention the oxide layer 1310 is deposited by plasma enhanced chemical vapor deposition (PECVD).

Persons who are skilled in the art will recognize that the oxide layer 1310 could alternatively be deposited with low pressure chemical vapor deposition (LPCVD) or thermally grown. In the case of PECVD or LPCVD the oxide layer 1310 is formed simultaneously on all surfaces of the wafer.

Figure 13A:
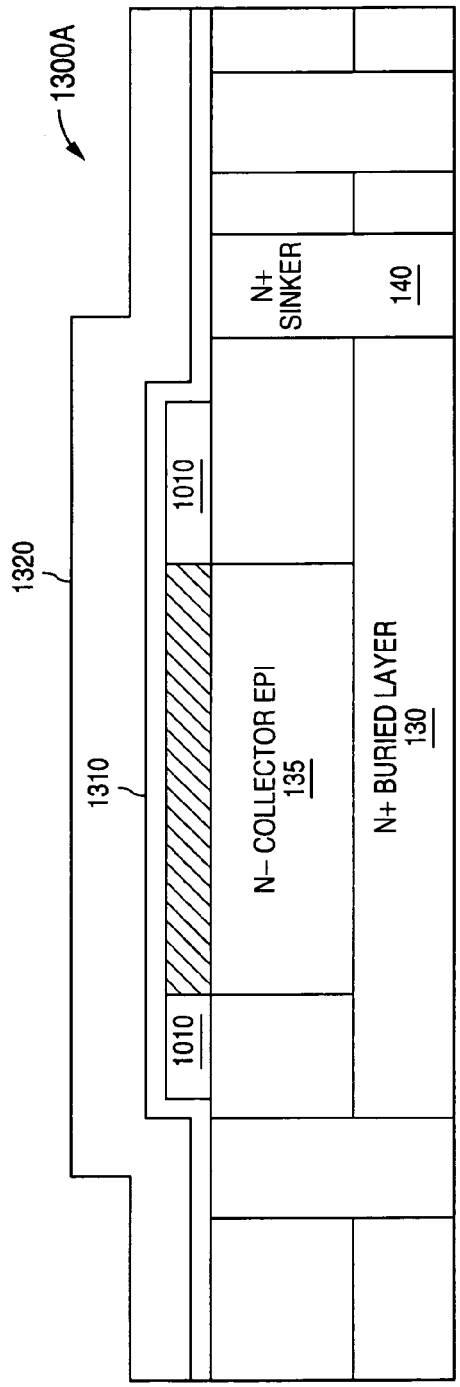
Figure 13B:
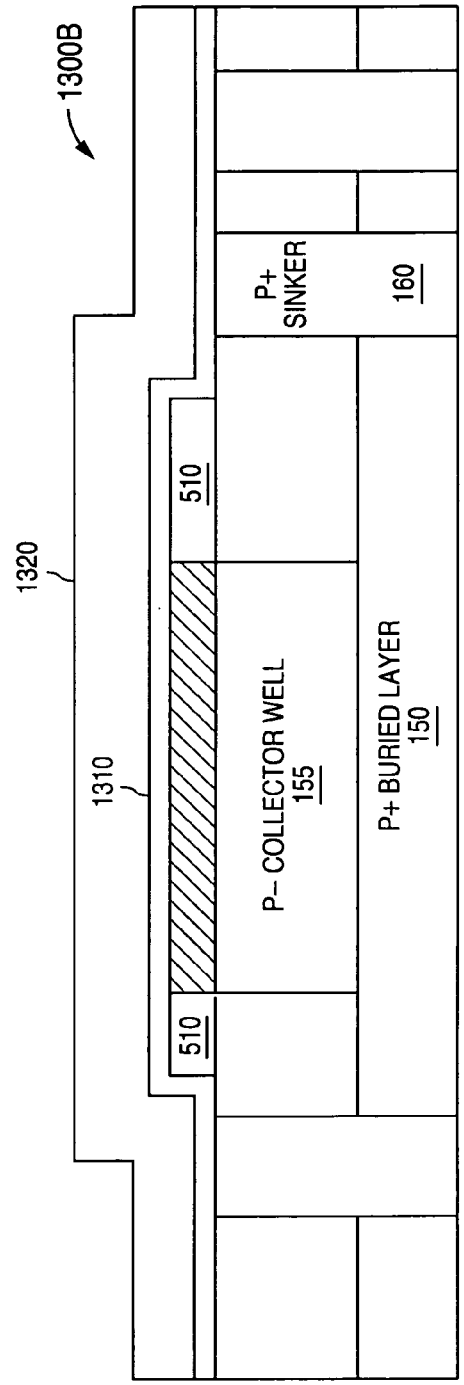

In the next step of the manufacturing method of the invention a nitride layer 1320 is formed over the oxide layer 1310. In an advantageous embodiment of the invention the thickness of the nitride layer 1320 is approximately three thousand Angstroms (3000 Å). The resulting structures (1300A and 1300B) are shown in FIG. 13A and in FIG. 13B.

Nitride is chosen because it has a lower chemical mechanical polishing (CMP) polish rate than oxide and because the nitride can be etched selectively to oxide. In an advantageous embodiment of the method of the invention the nitride layer 1320 is deposited by plasma enhanced chemical vapor deposition (PECVD). Persons who are skilled in the art will recognize that other deposition methods (such as LPCVD or photo assisted CVD) could also be used to form the nitride layer 1320.

Figure 14A:
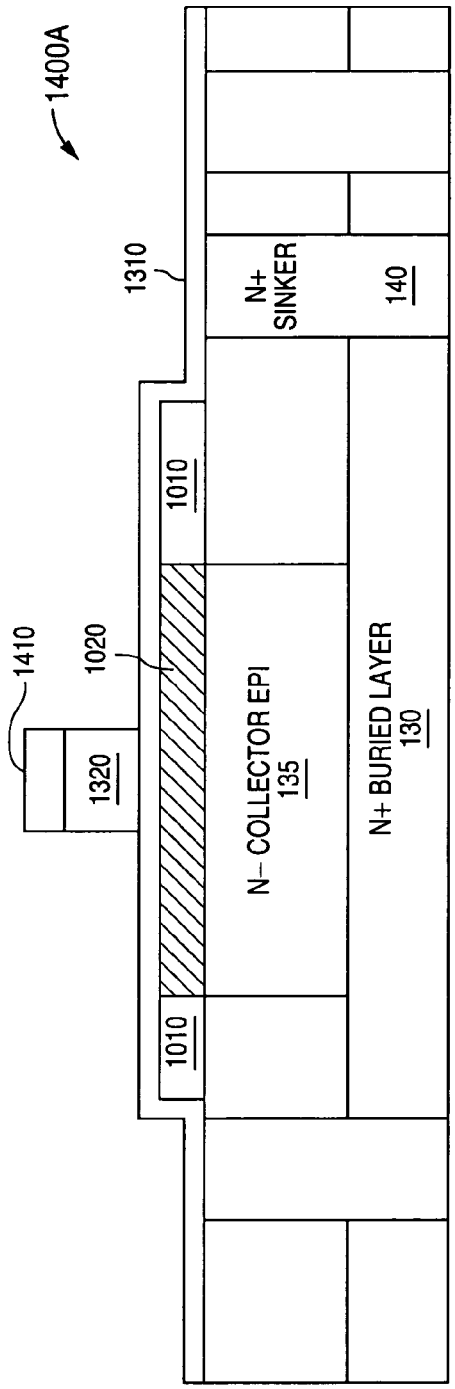
Figure 14B:
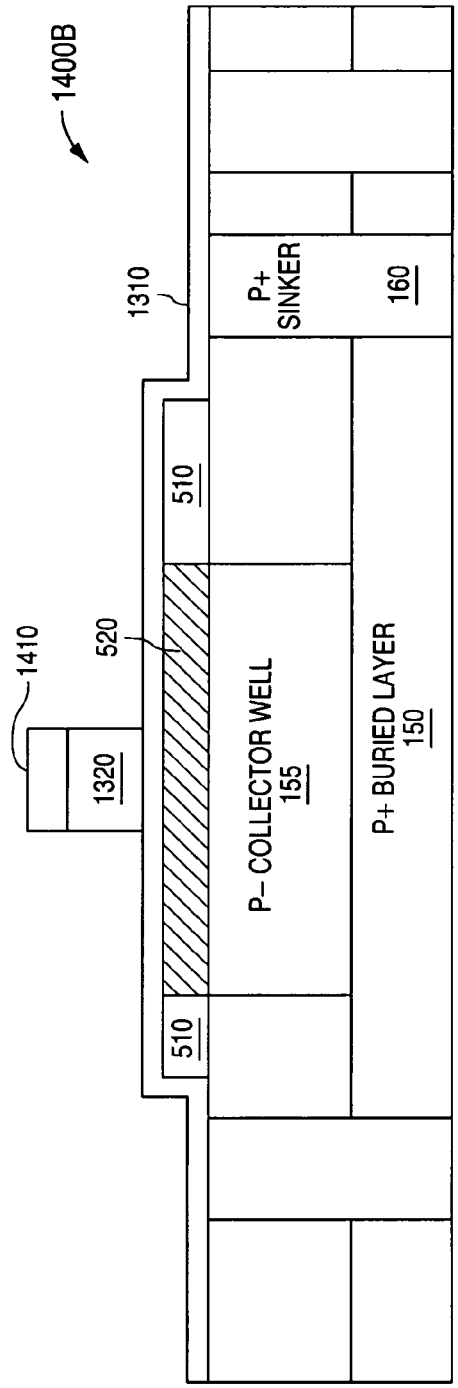

In the next step of the manufacturing method of the invention a photoresist layer 1410 is placed over the nitride layer 1310. Portions of the photoresist layer 1410 are then selectively removed from all but the center of the emitter/base area of the NPN transistor and from all but the center of the emitter/base area of the PNP transistor. The exposed portions of the nitride layer 1320 are then selectively etched where the photoresist layer 1410 has been removed with the etch stopping on the underlying oxide layer 1310. The resulting structures (1400A and 1400B) are shown in FIG. 14A and in FIG. 14B.

In the next step of the manufacturing method of the invention the remaining portions of the photoresist layer 1410 are removed. Persons who are skilled in the are will recognize that the underlying oxide layer 1310 could be removed at this time as well, either with a wet etch or with a dry etch that stops on the underlying silicon of an epitaxial base.

Persons who are skilled in the art will also recognize that the next two mask and etch implant steps that will be described could be combined with the patterning of the nitride layer 1320. This would exchange three mask layers for two mask layers. In an advantageous embodiment of a method of the invention three mask layers are used to reduce the number of etching steps that are required. The "two mask layer" method requires two etch steps while the "three mask layer" method requires only one etch step.

In the next step of the manufacturing method of the invention a photoresist layer 1510 is placed over the wafer. Portions of the photoresist layer 1510 are then selectively removed from the epitaxial base region of the PNP transistor.

Persons who are skilled in the art will recognize that the exposed portions of oxide layer 1310 could also be removed at this point. Persons who are skilled in the art will also recognize that in the "two mask layer" method the nitride layer 1320 would be patterned at this point, removing the nitride layer 1320 from over the areas that will form the extrinsic base of the PNP transistor. In the "two mask layer" method the photoresist 1410 would be left on top of the nitride layer 1320 in the center of the PNP transistor structure.

In the next step of the manufacturing method of the invention the exposed portions of the epitaxial layer 510 and the epitaxial base 520 are now doped to form the extrinsic base 1520 of the PNP transistor structure. The nitride layer 1320 in the center of the PNP transistor structure forms a nitride mask that blocks the doping from reaching the emitter area. In an advantageous embodiment of the method of the invention the extrinsic base 1520 is doped with an ion implant. The resulting structures (1500A and 1500B) are shown in FIG. 15A and in FIG. 15B.

After the extrinsic base 1520 has been doped, the remaining portions of the photoresist layer 1510 are removed. Persons who are skilled in the art will recognize that the extrinsic base 1520 could also be doped by other methods (e.g., POCl3, PGILD, doped glass). With some of these other methods the photoresist layer 1510 may need to be removed. With some of these other methods the oxide layer 1310 over the extrinsic base 1520 may need to be removed before removing the photoresist layer 1510.

In the next step of the manufacturing method of the invention a photoresist layer 1610 is placed over the wafer. Portions of the photoresist layer 1610 are then selectively removed from the epitaxial base region of the NPN transistor.

Persons who are skilled in the art will recognize that the exposed portions of oxide layer 1310 could also be removed at this point. Persons who are skilled in the art will also recognize that in the "two mask layer" method the nitride layer 1320 would be patterned at this point, removing the nitride layer 1320 from over the areas that will form the extrinsic base of the NPN transistor. In the "two mask layer" method the photoresist 1410 would be left on top of the nitride layer 1320 in the center of the NPN transistor structure 1600A.

In the next step of the manufacturing method of the invention the exposed portions of the epitaxial layer 1010 and the epitaxial base 1020 of the NPN transistor structure are now doped to form the extrinsic base 1620. The nitride layer 1320 in the center of the NPN transistor structure forms a nitride mask that blocks the doping from reaching the emitter area. In an advantageous embodiment of the method of the invention the extrinsic base 1620 is doped with an ion implant. The resulting structures (1600A and 1600B) are shown in FIG. 16A and in FIG. 16B.

After the extrinsic base 1620 has been doped, the remaining portions of the photoresist layer 1610 are removed. Persons who are skilled in the art will recognize that the extrinsic base 1620 could also be doped by other methods (e.g., POCl3, PGILD, doped glass). With some of these other methods the photoresist layer 1610 may need to be removed. With some of these other methods the oxide layer 1310 over the extrinsic base 1620 may need to be removed before removing the photoresist layer 1610.

In the next step of the manufacturing method of the invention a thick oxide layer 1710 is formed over the wafer. In an advantageous embodiment of the invention the thickness of the oxide layer 1710 is approximately ten thousand Angstroms (10,000 Å). The resulting structures (1700A and 1700B) are shown in FIG. 17A and in FIG. 17B.

Oxide is chosen for oxide layer 1710 because oxide has a higher chemical mechanical polishing (CMP) polish rate than nitride and because oxide can be etched selectively to silicon. In an advantageous embodiment of the method of the invention the oxide layer 1710 is deposited by plasma enhanced chemical vapor deposition (PECVD). Persons who are skilled in the art will recognize that other deposition methods (such as LPCVD or photo assisted CVD) could also be used to form the oxide layer 1710.

In the prior art this oxide layer is thermally grown. Thermally growing the oxide layer 1710 is undesirable for at least two reasons. First, it requires the deposition and etching of multiple film stacks to prevent oxidation in the extrinsic base and deep collector areas. These depositions and subsequent patterning of the stacks add process complexity. Second, the thermal oxidation requires a thermal cycle that spreads the base doping and negatively affects transistor performance.

Chemical mechanical polishing (CMP) is now applied using a system that removes oxide at a higher rate than nitride. The CMP is applied until the top of the nitride 1320 is no longer covered with oxide 1710. In an advantageous embodiment of the invention the thickness of the oxide layer 1710 after CMP is approximately three Angstroms (3,000 Å). The resulting structures (1800A and 1800B) are shown in FIG. 18A and in FIG. 18B.

Persons who are skilled in the art will recognize that a reverse mask and etch could be applied before the CMP to reduce the amount of CMP required to expose the underlying nitride 1320 over the emitter areas.

In the next step of the manufacturing method of the invention the nitride 1320 is removed with an etch process that is selective to oxide. When the nitride 1320 is removed from the NPN transistor structure an aperture 1910 (NPN aperture 1910) is formed in the oxide 1710. When the nitride 1320 is removed from the PNP transistor structure an aperture 1920 (PNP aperture 1920) is formed in the oxide 1710. The resulting structures (1900A and 1900B) are shown in FIG. 19A and in FIG. 19B. In an advantageous embodiment of the method of the invention a wet phosphoric acid and water etch is used. Persons who are skilled in the art will recognize that plasma etching could also be used.

Persons who are skilled in the art will also recognize that if different interfacial oxides are desired for the NPN transistors and PNP transistors (or for transistors that have different performance characteristics such as higher beta or lower 1/f noise) then the nitride 1320 could be masked with photoresist and only removed from some locations. This would enable subsequent processing to apply the polysilicon emitters in two different depositions.

In the next step of the manufacturing method of the invention spacers 2010 are formed on the inside walls of the apertures (1910 and 1920) in the oxide 1710 that remain when the nitride 1320 is removed. The resulting structures (2000A and 2000B) are shown in FIG. 20A and in FIG. 20B. In an advantageous embodiment of the method of the invention the spacers 2010 are formed from amorphous silicon deposited by low pressure chemical vapor deposition (LPCVD).

Persons who are skilled in the art will recognize that other materials such as polysilicon or nitride could be used to form the spacers 2010. Persons who are skilled in the art will also recognize that other deposition methods such as plasma assisted chemical vapor deposition (PECVD) or photo assisted chemical vapor deposition could also be used to deposit the spacers 2010.

Figure 21A:
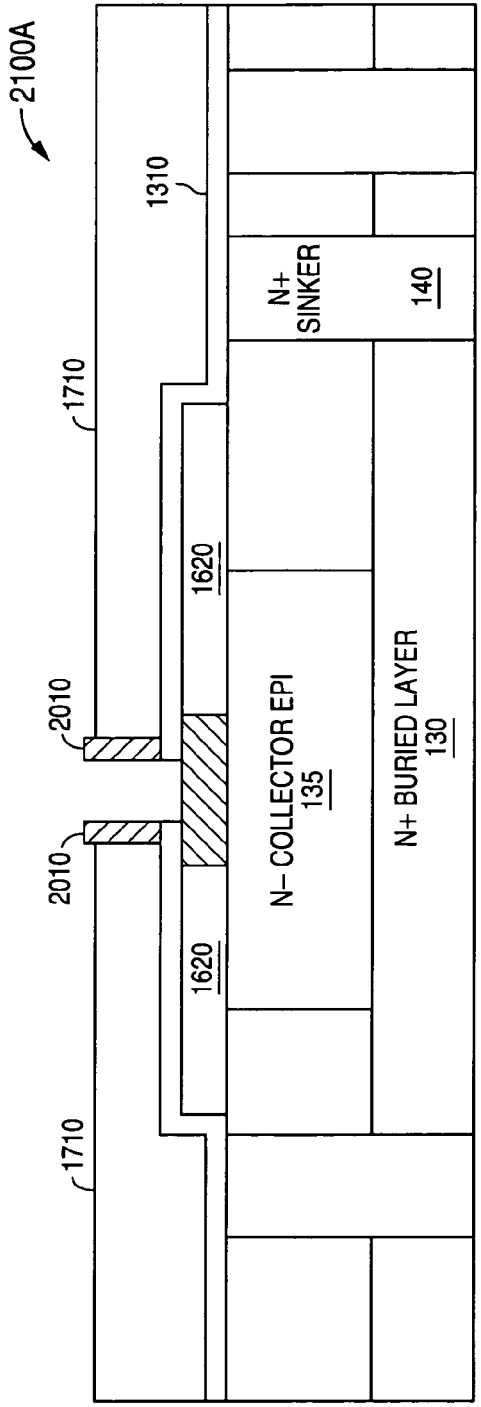
Figure 21B:
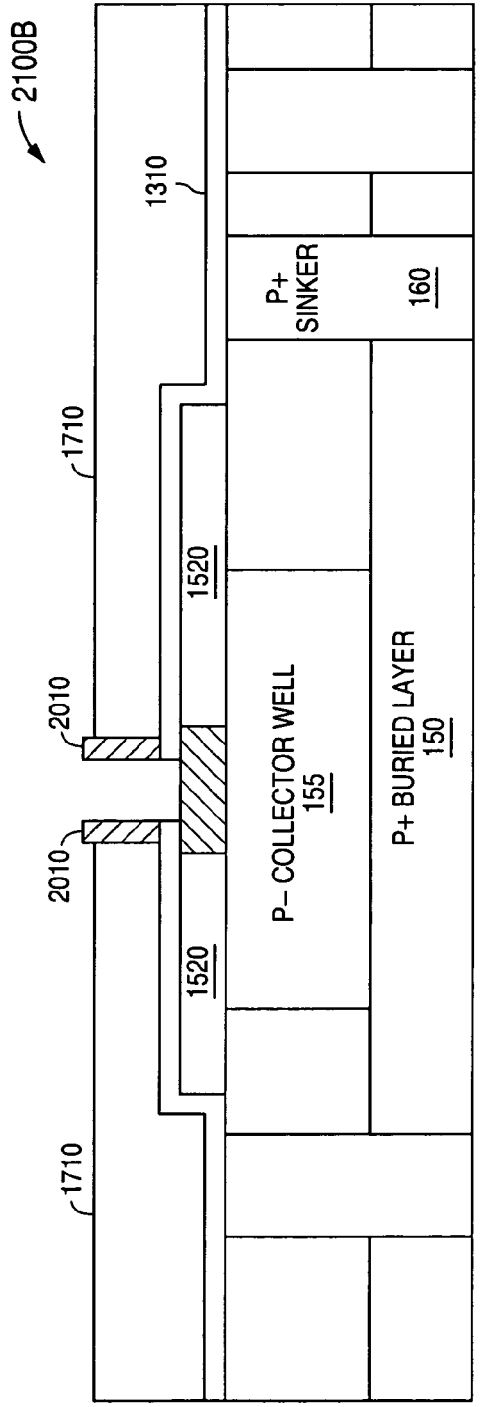

In the next step of the manufacturing method of the invention the portions of oxide 1310 exposed at the bottom of the apertures (1910 and 1920) between the spacers 2010 are removed with an etch process. A small amount of the top layer of oxide 1710 is also removed during the etch process. The resulting structures (2100A and 2100B) are shown in FIG. 21A and in FIG. 21B. In an advantageous embodiment of the method of the invention the portions of oxide 1310 (and oxide 1710) are removed with a wet etch selective to the silicon spacers 2010 and epitaxial bases (520 and 1020). Persons who are skilled in the art will recognize that a selective dry etch process could also be used.

Figure 22A:
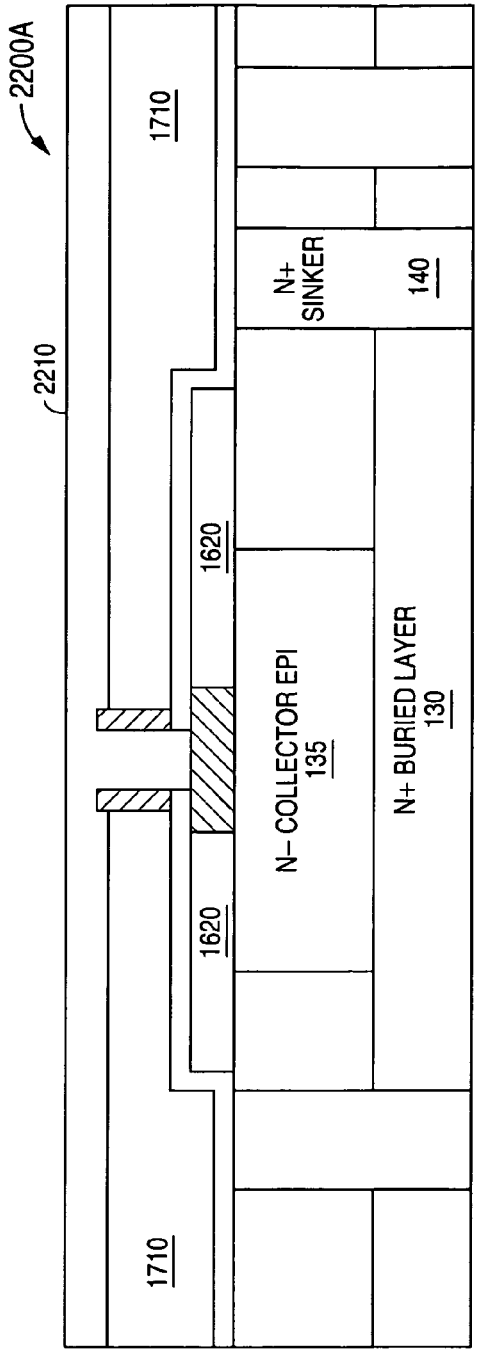
Figure 22B:
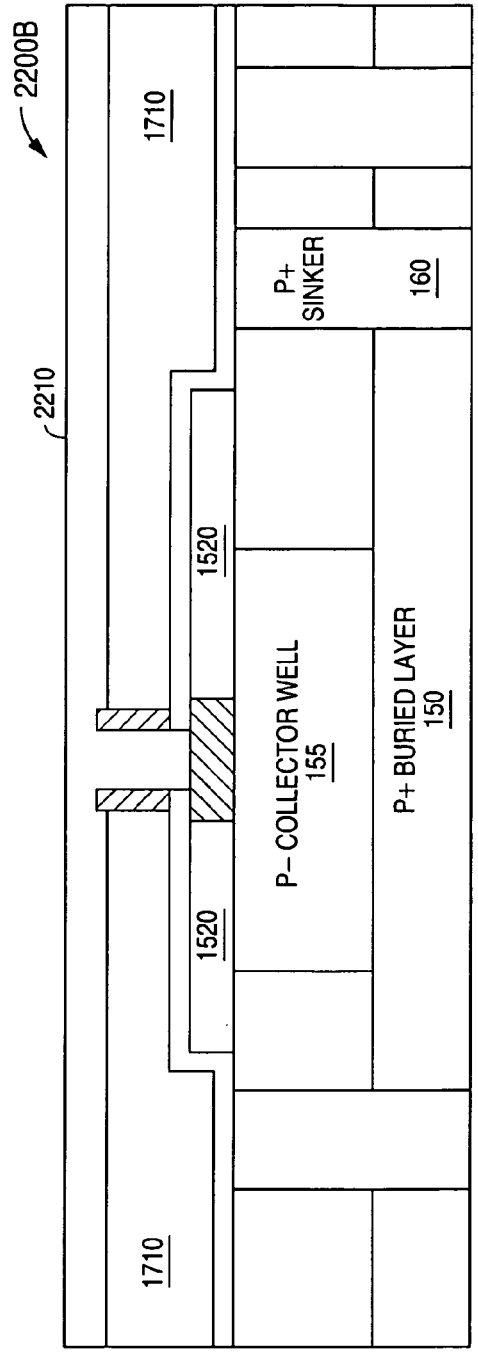

In the next step of the manufacturing method of the invention a layer of emitter polysilicon 2210 is deposited on the wafer. The resulting structures (2200A and 2200B) are shown in FIG. 22A and in FIG. 22B.

In an advantageous embodiment of the method of the invention a thin thermal oxide layer (not shown) having a thickness of approximately twelve Angstroms (12 Å) to fifteen Angstroms (15 Å) can be grown on the wafer prior to the deposition of the emitter polysilicon 2210. Persons who are skilled in the art will recognize that this thin thermal oxide layer could be formed in some other manner (e.g. RCA preclean). The impact of the oxide on beta, emitter resistance, 1/f noise and other parameters is well known. The step of forming the thin thermal oxide layer is an optional step.

Persons who are skilled in the art will recognize that at this point a thermal treatment either in a conventional furnace or in a rapid thermal processor could be applied to break up the interfacial oxide prior the to application of the emitter doping procedure.

Figure 23A:
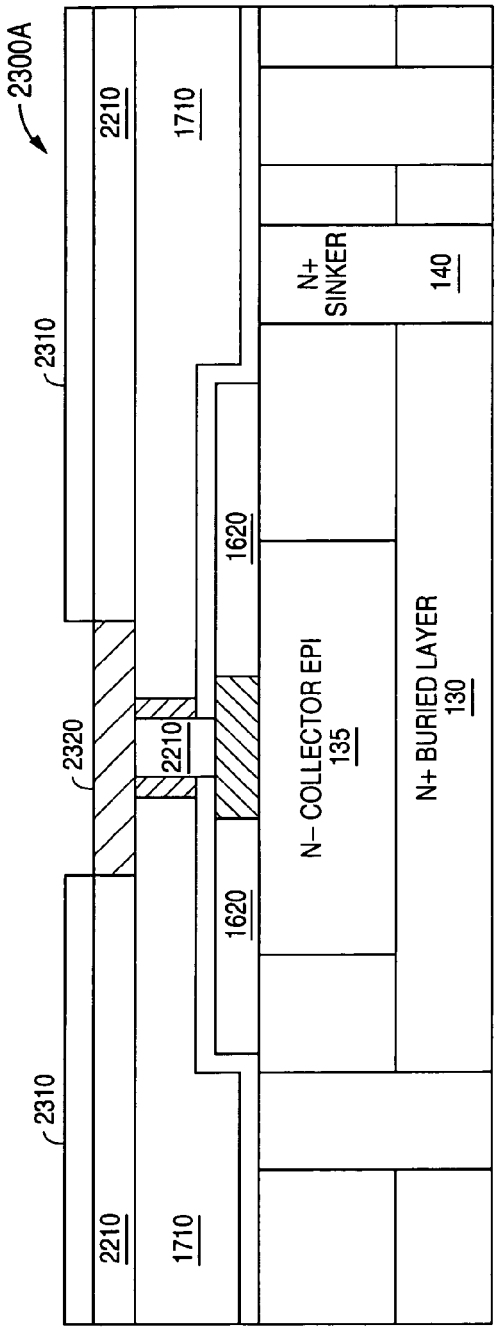
Figure 23B:
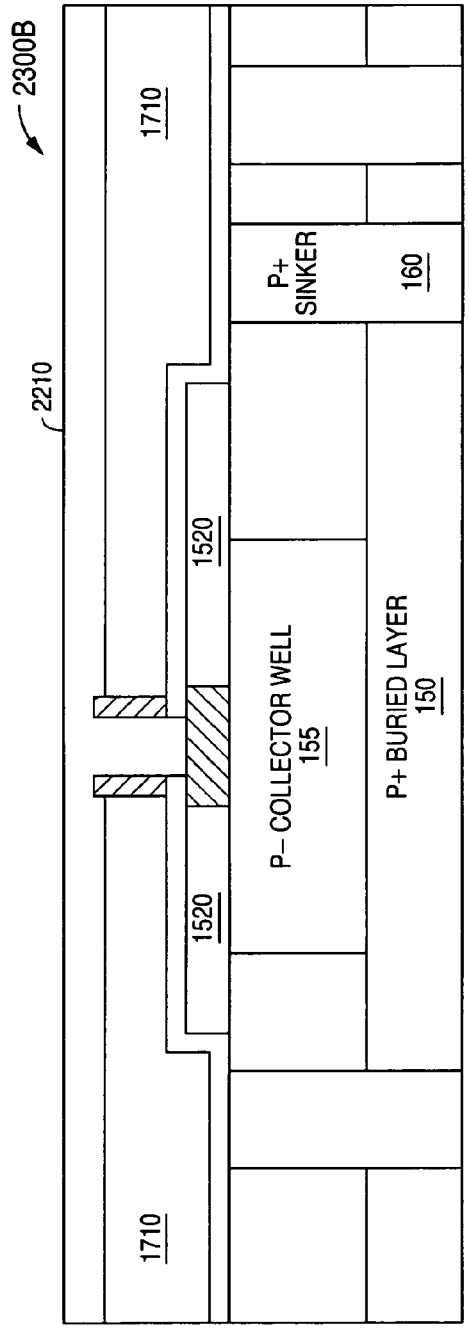

In the next steps of the manufacturing method of the invention a photoresist layer 2310 is placed over the NPN transistor. Then portions of the photoresist layer 2310 are removed over the emitter region of the NPN transistor exposing portions of the emitter polysilicon 2210. Then the exposed portions of the emitter polysilicon 2210 are doped. The doped portion of the emitter polysilicon 2210 is designated with reference numeral 2320. The resulting structures (2300A and 2300B) are shown in FIG. 23A and in FIG. 23B.

In an advantageous embodiment of the method of the invention the emitter 2320 is doped with an ion implant. Persons who are skilled in the art will recognize that the emitter 2320 could also be doped by other methods (e.g., POCl3, PGILD, doped glass). With some of these other methods the photoresist layer 2310 may need to be removed.

In the next step of the manufacturing method of the invention the remaining portions of the photoresist layer 2310 are removed. Persons who are skilled in the art will recognize that at this point a thermal treatment either in a conventional furnace or in a rapid thermal processor could be applied to drive or activate the NPN emitter 2320 prior to the subsequent doping of the PNP emitter.

In the next steps of the manufacturing method of the invention a photoresist layer 2410 is placed over the PNP transistor. Then portions of the photoresist layer 2410 are removed over the emitter region of the PNP transistor exposing portions of the emitter polysilicon 2210. Then the exposed portions of the emitter polysilicon 2210 are doped. The doped portion of the emitter polysilicon 2210 is designated with reference numeral 2420. The resulting structures (2400A and 2400B) are shown in FIG. 24A and in FIG. 24B.

In an advantageous embodiment of the method of the invention the emitter 2420 is doped with an ion implant. Persons who are skilled in the art will recognize that the emitter 2420 could also be doped by other methods (e.g., BBr3, PGILD, doped glass). With some of these other methods the photoresist layer 2410 may need to be removed.

Figure 25A:
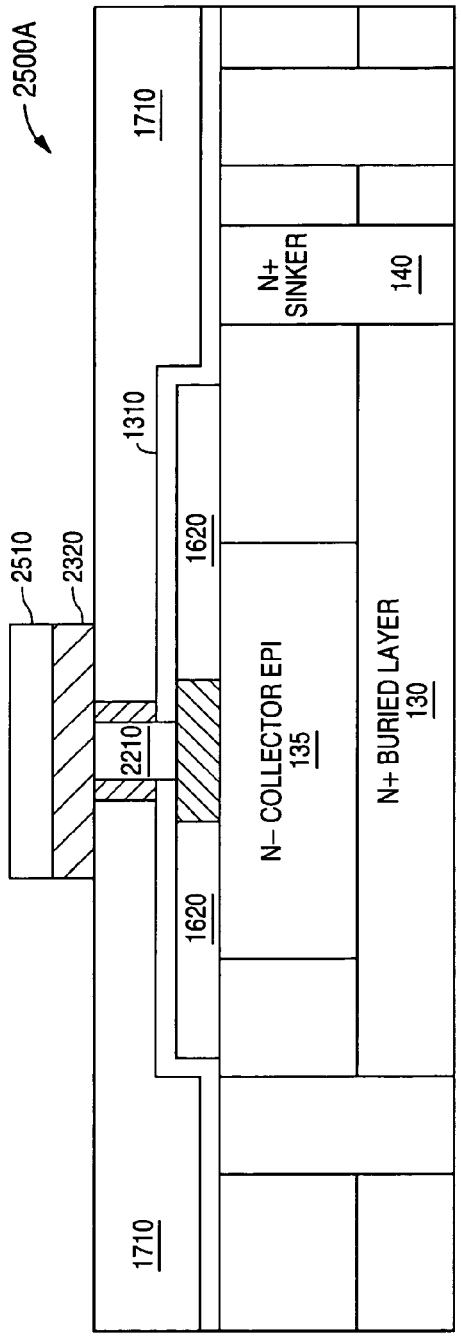
Figure 25B:
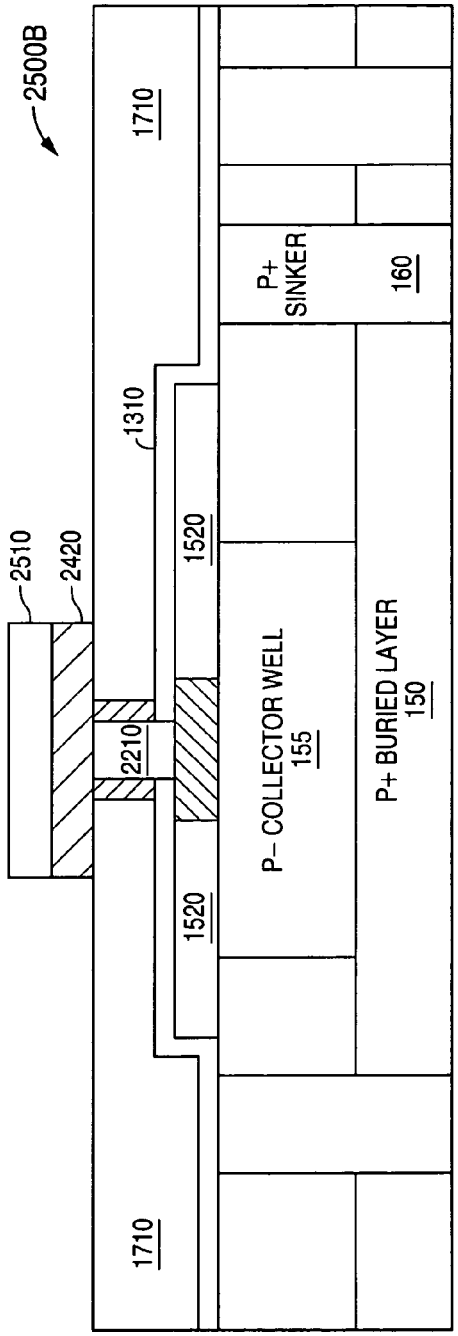

In the next steps of the manufacturing method of the invention the remaining portions of the photoresist layer 2410 are removed. Then another photoresist layer 2510 is placed over the wafer. Then selected portions of the photoresist layer 2510 are removed leaving portions of photoresist layer 2510 over the NPN emitter 2320 and over the PNP emitter 2420. Then the exposed portions of the emitter polysilicon layer 2210 are etched away with the etch stopping at the underlying oxide layer 1710. The resulting structures (2500A and 2500B) are shown in FIG. 25A and in FIG. 25B.

In the next steps of the manufacturing method of the invention the remaining portions of the photoresist layer 2510 are left in place and the exposed portions of oxide layer 1710 and oxide layer 1310 are etched away. The resulting structures (2600A and 2600B) are shown in FIG. 26A and in FIG. 26B. The oxide layers (1710 and 1310) are removed to expose the extrinsic base regions (1520 and 1620) to metal deposition for a salicide process.

In an advantageous embodiment of the method of the invention the portions of oxide layer 1710 and oxide layer 1310 are removed with a dry etch stopping on silicon. Persons who are skilled in the art will recognize that a wet etch process could also be used. Alternatively, the oxide layers 1710 and 1310 could be left in place.

Figure 27A:
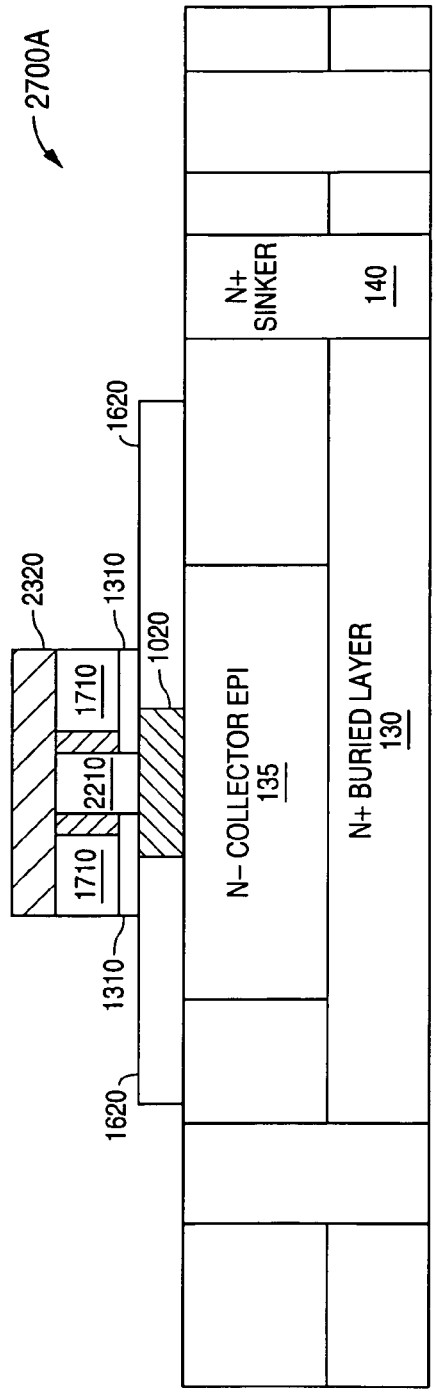
Figure 27B:
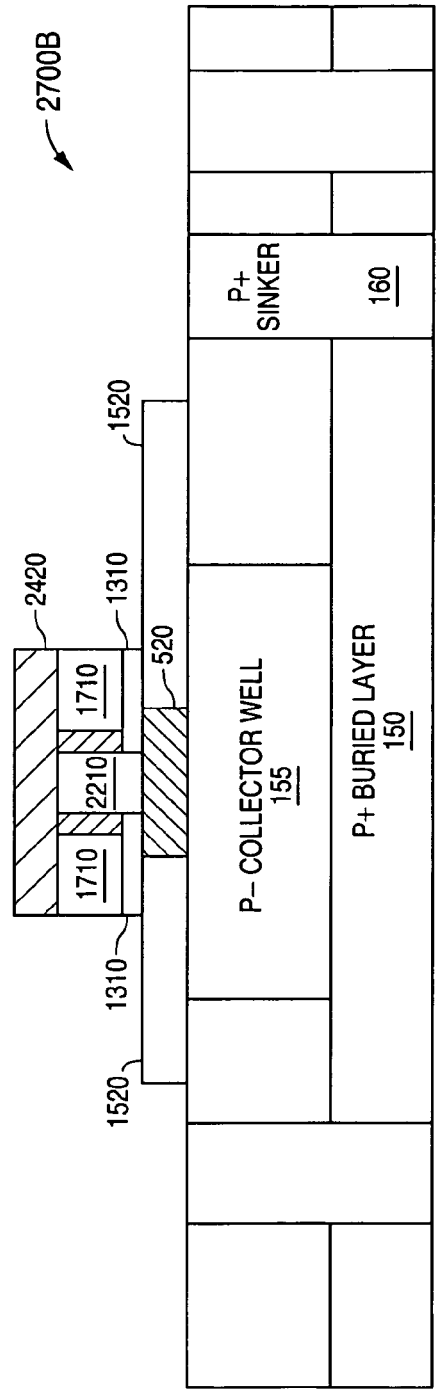

In the next step of the manufacturing method of the invention the remaining portions of the photoresist layer 2510 are removed. The resulting structures (2700A and 2700B) are shown in FIG. 27A and in FIG. 27B. A thermal treatment is now applied to drive the emitter doping and to break up the interfacial oxide if necessary. After the thermal treatment the semiconductor wafers are processed through standard back-end processing.

In the advantageous method of the invention described above the first epitaxial base 520 of the PNP transistor was formed before the second epitaxial base 1020 of the NPN transistor. Persons who are skilled in the art will recognize that the order of the steps of the method could be reversed. That is, it is possible to form the epitaxial base of the PNP transistor before forming the epitaxial base of the NPN transistor.

Figure 28:
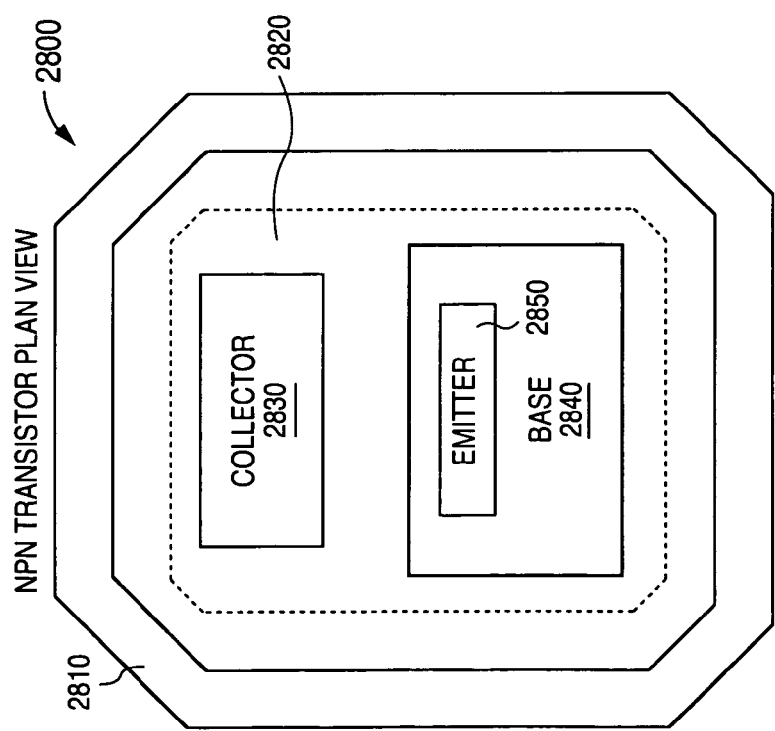
FIG. 28 illustrates a diagrammatic top plan view of the layout of an NPN bipolar transistor manufactured using the method of the present invention.

FIG. 28 illustrates a diagrammatic top plan view of the layout of an exemplary NPN bipolar transistor 2800 manufactured using the method of the present invention. The portion of NPN bipolar transistor 2800 that is designated with reference numeral 2810 is an isolation trench such as deep trench isolation (DTI) layer 125. The dotted outline that is designated with reference numeral 2820 represents the N+ buried layer 130.

In this advantageous embodiment of the NPN bipolar transistor 2800 the rectangle that is designated as collector 2830 represents N+ sinker 140. The rectangle that is designated as base 2840 represents the extrinsic base 1620. The rectangle that is designated as emitter 2850 represents the NPN emitter 2320.

Figure 29:
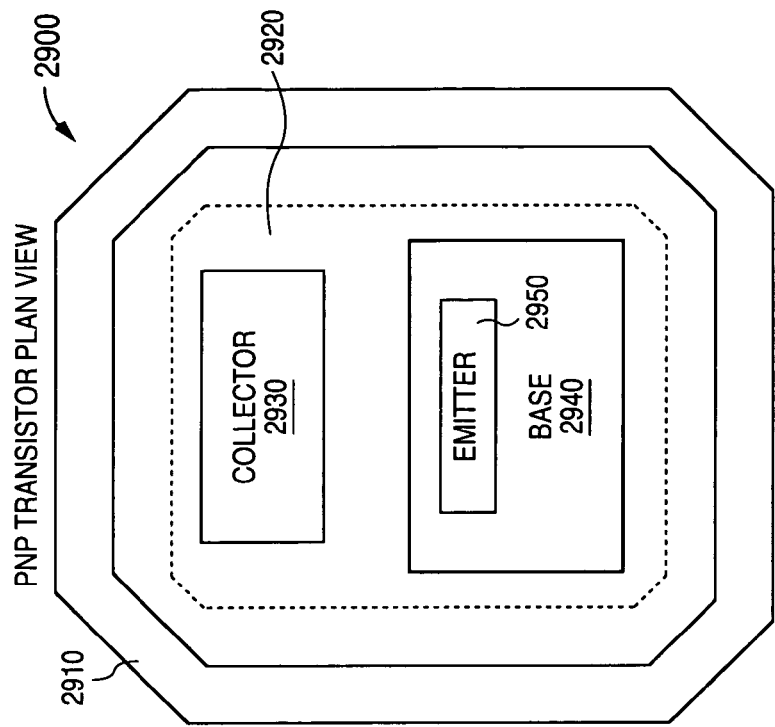
FIG. 29 illustrates a diagrammatic top plan view of the layout of a PNP bipolar transistor manufactured using the method of the present invention.

FIG. 29 illustrates a diagrammatic top plan view of the layout of an exemplary PNP bipolar transistor 2900 manufactured using the method of the present invention. The portion of PNP bipolar transistor 2900 that is designated with reference numeral 2910 is an isolation trench such as deep trench isolation (DTI) layer 125. The dotted outline that is designated with reference numeral 2920 represents the P+ buried layer 150.

In this advantageous embodiment of the PNP bipolar transistor 2900 the rectangle that is designated as collector 2930 represents P+ sinker 160. The rectangle that is designated as base 2940 represents the extrinsic base 1520. The rectangle that is designated as emitter 2950 represents the PNP emitter 2420.

Although the present invention has been described with an exemplary embodiment, various changes and modifications may be suggested to one skilled in the art. It is intended that the present invention encompass such changes and modifications as fall within the scope of the appended claims.

The invention claimed is:

1. A method for manufacturing a PNP bipolar transistor, the method comprising the steps of:
forming a P type collector;
forming a PNP epitaxial base over the P type collector;
forming a PNP extrinsic base in the PNP epitaxial base; and
forming a PNP emitter in electrical contact with the PNP extrinsic base;
wherein forming the PNP extrinsic base comprises forming a first oxide layer over the PNP epitaxial base; and
wherein forming the PNP emitter comprises:
forming a second oxide layer over the first oxide layer;
forming the PNP emitter over the second oxide layer;
forming a mask over the PNP emitter; and
removing portions of the first and second oxide layers not covered by the mask down to the PNP extrinsic base.

2. The method as set forth in claim 1 wherein the step of forming the PNP epitaxial base comprises the steps of:
forming a PNP epitaxial layer over the P type collector; and
doping the PNP epitaxial layer to form the PNP epitaxial base in the PNP epitaxial layer.

3. The method as set forth in claim 2 further comprising the steps of:
forming a photoresist mask over the PNP epitaxial base and over portions of the PNP epitaxial layer on sides of the PNP epitaxial base;
removing exposed portions of the PNP epitaxial layer; and
removing the photoresist mask.

4. The method as set forth in claim 1 wherein the step of forming the PNP extrinsic base comprises the steps of:
a forming the first oxide layer over the PNP epitaxial base and over portions of a PNP epitaxial layer on sides of the PNP epitaxial base;
forming a nitride layer over the first oxide layer; and
applying a mask and etch procedure to form a nitride mask over a central portion of the PNP epitaxial base.

5. The method as set forth in claim 4 wherein the step of forming the PNP extrinsic base further comprises the steps of:
forming a photoresist mask over the nitride mask and over the first oxide layer;
removing portions of the photoresist mask over the nitride mask and over portions of the first oxide layer that overlie the PNP epitaxial base and the PNP epitaxial layer on the sides of the PNP epitaxial base;
doping exposed portions of the PNP epitaxial base and the PNP epitaxial layer on the sides of the PNP epitaxial base to form the PNP extrinsic base; and
removing the photoresist mask.

6. The method as set forth in claim 4 wherein the step of forming the PNP emitter comprises the steps of:
a forming the second oxide layer over the nitride mask and over the first oxide layer;
removing portions of the second oxide layer down to a top surface of the nitride mask;
removing the nitride mask to form a PNP aperture; and
forming spacers on vertical surfaces of the PNP aperture.

7. The method as set forth in claim 6 wherein the step of forming the PNP emitter further comprises the steps of:
removing portions of the first oxide layer that are located at a bottom of the PNP aperture;
forming a polysilicon layer over the second oxide layer and in the PNP aperture; and
applying a mask and etch procedure to form the PNP emitter over the PNP aperture.

8. The method as set forth in claim 7 wherein the step of forming the PNP emitter further comprises the steps of:
forming a photoresist mask over the PNP emitter and over the polysilicon layer, wherein the mask over the PNP emitter comprises the photoresist mask;
removing portions of the photoresist mask but not a portion of the photoresist mask over the PNP emitter;
removing exposed portions of the polysilicon layer down to the second oxide layer;
removing exposed portions of the second oxide layer down to the first oxide layer;
removing exposed portions of the first oxide layer down to the PNP extrinsic base; and
removing the photoresist mask.

9. A method for manufacturing an NPN bipolar transistor, the method comprising the steps of:
forming an N type collector;
forming an NPN epitaxial base over the N type collector;
forming an NPN extrinsic base in the NPN epitaxial base; and
forming an NPN emitter in electrical contact with the NPN extrinsic base;
wherein forming the NPN extrinsic base comprises forming a first oxide layer over the NPN epitaxial base; and
wherein forming the NPN emitter comprises:
forming a second oxide layer over the first oxide layer;
forming the NPN emitter over the second oxide layer;
forming a mask over the NPN emitter; and
removing portions of the first and second oxide layers not covered by the mask down to the NPN extrinsic base.

10. The method as set forth in claim 9 wherein the step of forming the NPN epitaxial base comprises the steps of:
forming an NPN epitaxial layer over the N type collector; and
doping the NPN epitaxial layer to form the NPN epitaxial base in the NPN epitaxial layer.

11. The method as set forth in claim 10 further comprising the steps of:
forming a photoresist mask over the NPN epitaxial base and over portions of the NPN epitaxial layer on sides of the NPN epitaxial base;
removing exposed portions of the NPN epitaxial layer; and
removing the photoresist mask.

12. The method as set forth in claim 9 wherein the step of forming the NPN extrinsic base comprises the steps of:
forming the first oxide layer over the NPN epitaxial base and over portions of an NPN epitaxial layer on sides of the NPN epitaxial base;
forming a nitride layer over the first oxide layer; and
applying a mask and etch procedure to form a nitride mask over a central portion of the NPN epitaxial base.

13. The method as set forth in claim 12 wherein the step of forming the NPN extrinsic base further comprises the steps of:
forming a photoresist mask over the nitride mask and over the first oxide layer;
removing portions of the photoresist mask over the nitride mask and over portions of the first oxide layer that overlie the NPN epitaxial base and the NPN epitaxial layer on the sides of the NPN epitaxial base;
doping exposed portions of the NPN epitaxial base and the NPN epitaxial layer on the sides of the NPN epitaxial base to form the NPN extrinsic base; and
removing the photoresist mask.

14. The method as set forth in claim 12 wherein the step of forming the NPN emitter comprises the steps of:
forming the second oxide layer over the nitride mask and over the first oxide layer;

removing portions of the second oxide layer down to a top surface of the nitride mask;
removing the nitride mask to form an NPN aperture; and
forming spacers on vertical surfaces of the NPN aperture.

15. The method as set forth in claim 14 wherein the step of forming the NPN emitter further comprises the steps of:
removing portions of the first oxide layer that are located at a bottom of the NPN aperture;
forming a polysilicon layer over the second oxide layer and in the NPN aperture; and
applying a mask and etch procedure to form the NPN emitter over the NPN aperture.

16. The method as set forth in claim 15 wherein the step of forming the NPN emitter further comprises the steps of:
forming a photoresist mask over the NPN emitter and over the polysilicon layer, wherein the mask over the NPN emitter comprises the photoresist mask;
removing portions of the photoresist mask but not a portion of the photoresist mask over the NPN emitter;
removing exposed portions of the polysilicon layer down to the second oxide layer;
removing exposed portions of the second oxide layer down to the first oxide layer;
removing exposed portions of the first oxide layer down to the NPN extrinsic base; and
removing the photoresist mask.

17. A method for manufacturing a PNP bipolar transistor and an NPN bipolar transistor, the method comprising the steps of:
forming a P type collector;
forming an N type collector;
forming a PNP epitaxial base over the P type collector;
forming an NPN epitaxial base over the N type collector;
forming a PNP extrinsic base in the PNP epitaxial base;
forming an NPN extrinsic base in the NPN epitaxial base;
forming a PNP emitter in electrical contact with the PNP extrinsic base; and
forming an NPN emitter in electrical contact with the NPN extrinsic base;
wherein forming the PNP extrinsic base and forming the NPN extrinsic base comprise forming a first oxide layer over the PNP and NPN epitaxial bases; and
wherein forming the PNP emitter and forming the NPN emitter comprise:
forming a oxide layer over the first oxide layer;
forming the PNP emitter and the NPN emitter over the second oxide layer;
forming a mask over the PNP emitter and over the NPN emitter; and
removing portions of the first and second oxide layers not covered by the mask down to the PNP extrinsic base and down to the NPN extrinsic base.

18. The method as set forth in claim 17:
wherein the step of forming the PNP epitaxial base comprises the steps of:
forming a PNP epitaxial layer over the P type collector; and
doping the PNP epitaxial layer to form the PNP epitaxial base in the PNP epitaxial layer; and
wherein the step of forming the NPN epitaxial base comprises the steps of:
forming an NPN epitaxial layer over the N type collector; and
doping the NPN epitaxial layer to form the NPN epitaxial base in the NPN epitaxial layer.

19. The method as set forth in claim 17 wherein the step of forming the PNP extrinsic base and the step of forming the NPN extrinsic base comprise the steps of:
forming the first oxide layer (1) over the PNP epitaxial base and over portions of a PNP epitaxial layer on sides of the PNP epitaxial base and (2) over the NPN epitaxial base and over portions of an NPN epitaxial layer on sides of the NPN epitaxial base;
forming a nitride layer over the first oxide layer; and
applying a mask and etch procedure to form a first nitride mask over a central portion of the PNP epitaxial base and to form a second nitride mask over a central portion of the NPN epitaxial base.

20. The method as set forth in claim 19 wherein the step of forming the PNP extrinsic base and the step of forming the NPN extrinsic base further comprise the steps of:
forming a first photoresist mask over the first nitride mask and over the second nitride mask and over the first oxide layer;
removing portions of the first photoresist mask over the first nitride mask and over portions of the first oxide layer that overlie the PNP epitaxial base and the PNP epitaxial layer on the sides of the PNP epitaxial base;
doping exposed portions of the PNP epitaxial base and the PNP epitaxial layer on the sides of the PNP epitaxial base to form the PNP extrinsic base;
removing the first photoresist mask;
forming a second photoresist mask over the first nitride mask and over the second nitride mask and over the first oxide layer;
removing portions of the second photoresist mask over the second nitride mask and over portions of the first oxide layer that overlie the NPN epitaxial base and the NPN epitaxial layer on the sides of the NPN epitaxial base;
doping exposed portions of the NPN epitaxial base and the NPN epitaxial layer on the sides of the NPN epitaxial base to form the NPN extrinsic base; and
removing the second photoresist mask.

21. The method as set forth in claim 19 wherein the step of forming the PNP emitter and the step of forming the NPN emitter comprise the steps of:
forming the second oxide layer over the first nitride mask and over the second nitride mask and over the first oxide layer;
removing portions of the second oxide layer down to a top surface of the first nitride mask and down to a top surface of the second nitride mask;
removing the first nitride mask to form a PNP aperture;
forming spacers on vertical surfaces of the PNP aperture;
removing the second nitride mask to form an NPN aperture; and
forming spacers on vertical surfaces of the NPN aperture.

22. The method as set forth in claim 21 wherein the step of forming the PNP emitter and the step of forming the NPN emitter further comprise the steps of:
removing portions of the first oxide layer that are located at a bottom of the PNP aperture;
removing portions of the first oxide layer that are located at a bottom of the NPN aperture;
forming a polysilicon layer over the second oxide layer and in the PNP aperture and in the NPN aperture; and
applying at least one mask and etch procedure to form the PNP emitter over the PNP aperture and to form the NPN emitter over the NPN aperture.

23. The method as set forth in claim 22 wherein the step of forming the PNP emitter and the step of forming the NPN emitter further comprise the steps of:

forming a photoresist mask over the PNP emitter and over the NPN emitter and over the polysilicon layer, wherein the mask over the PNP emitter and over the NPN emitter comprises the photoresist mask;

removing portions of the photoresist mask but not portions of the photoresist mask over the PNP emitter and over the NPN emitter;

removing exposed portions of the polysilicon layer down to the second oxide layer;

removing exposed portions of the second oxide layer down to the first oxide layer;

removing exposed portions of the first oxide layer down to the PNP extrinsic base and down to the NPN extrinsic base; and removing the photoresist mask.

* * * * *